US012295507B2

(12) United States Patent
Velderman et al.

(10) Patent No.: US 12,295,507 B2
(45) Date of Patent: *May 13, 2025

(54) WALL HANGING SYSTEM

(71) Applicant: Black & Decker Inc., New Britain, CT (US)

(72) Inventors: Matthew J. Velderman, Baltimore, MD (US); Oleksiy Sergyeyenko, Baldwin, MD (US); Sean Bailey, Baltimore, MD (US); Steven J. Phillips, Ellicott City, MD (US); Daniel J. White, Baltimore, MD (US); Thomas Delmont, Clarksville, MD (US); Andrew E. Seman, Jr., Pylesville, MD (US); Julian Olyansky, Festerville, PA (US); Shalin Chikhalkar, Towson, MD (US)

(73) Assignee: Black & Decker Inc., New Britain, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/219,996

(22) Filed: Jul. 10, 2023

(65) Prior Publication Data
US 2023/0346140 A1 Nov. 2, 2023

Related U.S. Application Data

(63) Continuation of application No. 17/859,145, filed on Jul. 7, 2022, now Pat. No. 11,737,587, which is a
(Continued)

(51) Int. Cl.
A47F 5/08 (2006.01)
B25H 3/04 (2006.01)
(Continued)

(52) U.S. Cl.
CPC .......... *A47F 5/0853* (2013.01); *A47F 5/0846* (2013.01); *B25H 3/04* (2013.01);
(Continued)

(58) Field of Classification Search
CPC ...... A47F 5/0853; A47F 5/0846; A47F 3/001; A47F 1/10; A47F 5/0006; A47F 5/08;
(Continued)

(56) References Cited

U.S. PATENT DOCUMENTS 2,261,986 A 2/1940 Frank et al.
4,094,415 A * 6/1978 Larson .................. A47F 5/0823
211/85.15
(Continued)

FOREIGN PATENT DOCUMENTS

EP 2873495 B1 10/2017
JP 2004255503 9/2004
(Continued)

OTHER PUBLICATIONS

EP ESSR, dated Dec. 5, 2018 issued in corresponding EP application No. 18183078.7, 9 pages.

*Primary Examiner* — Jennifer E. Novosad
(74) *Attorney, Agent, or Firm* — Stephen R. Valancius

(57) ABSTRACT

A wall panel system including a first wall panel, the first panel including at least a first panel hook portion. The system also including a second wall panel having a different configuration than the first wall panel. The second panel includes at least a second panel hook portion and a third panel hook portion opposing the second panel hook portion. The first wall panel is configured to engage with the second wall panel to create a wall panel assembly.

20 Claims, 40 Drawing Sheets

Related U.S. Application Data continuation of application No. 17/150,295, filed on Jan. 15, 2021, now Pat. No. 11,406,203, which is a continuation of application No. 16/668,988, filed on Oct. 30, 2019, now Pat. No. 10,925,412, which is a continuation of application No. 15/946,248, filed on Apr. 5, 2018, now Pat. No. 10,492,631.

(60) Provisional application No. 62/544,962, filed on Aug. 14, 2017, provisional application No. 62/540,210, filed on Aug. 2, 2017, provisional application No. 62/532,077, filed on Jul. 13, 2017.

(51) Int. Cl.
| | |
|---|---|
| *H05K 7/14* | (2006.01) |
| *H05K 7/18* | (2006.01) |
| *A47F 3/00* | (2006.01) |
| *A47F 11/10* | (2006.01) |
| *H02J 7/00* | (2006.01) |
| *H02S 99/00* | (2014.01) |

(52) U.S. Cl.
CPC ......... *H05K 7/1457* (2013.01); *H05K 7/1459* (2013.01); *H05K 7/183* (2013.01); *A47F 3/001* (2013.01); *A47F 11/10* (2013.01); *H02J 7/0042* (2013.01); *H02S 99/00* (2013.01)

(58) Field of Classification Search
CPC ...... A47F 5/0807; A47F 5/083; A47F 5/0869; A47F 7/143; B25H 3/04; H05K 7/1457; H05K 7/1459; H05K 7/183; H02J 7/0042; H02S 99/00
USPC ......... 211/70.6, 94.01; 361/637; 248/222.14, 248/223.41, 224.51, 225.11, 225.13, 248/229.21; 52/220.7, 36.4, 36.5
See application file for complete search history.

(56) References Cited

U.S. PATENT DOCUMENTS

| | | | | |
|---|---|---|---|---|
| 4,406,064 | A | | 9/1983 | Goss |
| 4,420,087 | A | * | 12/1983 | Johns .................... A47F 5/0846 |
| | | | | 52/36.5 |
| 4,526,335 | A | | 7/1985 | Garfinkle |
| 4,603,715 | A | | 8/1986 | Muelhauser |
| 4,664,306 | A | | 5/1987 | Levy |
| 4,688,869 | A | | 8/1987 | Kelly |
| 4,726,554 | A | * | 2/1988 | Sorrell .................. A47F 5/0846 |
| | | | | 248/222.51 |
| 4,747,025 | A | * | 5/1988 | Barton .................... F21V 23/02 |
| | | | | 362/147 |
| 4,850,557 | A | | 7/1989 | Valiulis |
| RE33,596 | E | * | 5/1991 | Ennis .................... A47F 5/0846 |
| | | | | 411/84 |
| 5,180,128 | A | | 1/1993 | Massey |
| 5,259,519 | A | * | 11/1993 | Lieberman ................ A47K 1/09 |
| | | | | 211/94.01 |
| 5,306,165 | A | | 4/1994 | Nadeau |
| 5,360,121 | A | | 11/1994 | Sothman |
| 5,412,912 | A | * | 5/1995 | Alves .................... A47F 5/0846 |
| | | | | 52/36.5 |
| 5,418,328 | A | | 5/1995 | Nadeau |
| 5,484,067 | A | | 1/1996 | Sothman |
| 5,485,933 | A | * | 1/1996 | Crooymans ........... A47F 5/0846 |
| | | | | 211/90.04 |
| 5,485,934 | A | | 1/1996 | Holztrager |
| 5,531,415 | A | | 7/1996 | Kallemeyn |
| 5,603,621 | A | | 2/1997 | Elmouchi |
| 5,711,115 | A | * | 1/1998 | Wirt ........................ F24B 1/198 |
| | | | | 52/36.5 |
| 5,788,517 | A | | 8/1998 | Elmouchi |
| 5,794,795 | A | * | 8/1998 | Stemmons ............. H02B 1/052 |
| | | | | 211/94.01 |
| 5,897,002 | A | * | 4/1999 | Carlino ................. A47F 5/0846 |
| | | | | 211/94.01 |
| 5,921,044 | A | | 7/1999 | Holztrager |
| 5,956,799 | A | | 9/1999 | Panaccione et al. |
| 5,957,421 | A | | 9/1999 | Barbour |
| 5,983,574 | A | | 11/1999 | Holztrager |
| 6,113,201 | A | * | 9/2000 | Bauer ................... A47B 95/008 |
| | | | | 312/246 |
| 6,119,878 | A | * | 9/2000 | Zen ....................... A47F 5/0846 |
| | | | | 248/222.51 |
| 6,134,846 | A | * | 10/2000 | Lamb .................... A47F 5/0846 |
| | | | | 52/36.5 |
| 6,199,705 | B1 | * | 3/2001 | Portner .................. A47F 5/0846 |
| | | | | 211/94.01 |
| 6,393,877 | B1 | * | 5/2002 | Church .................. A47F 5/0861 |
| | | | | 70/57 |
| 6,454,231 | B1 | | 9/2002 | Fischer |
| 6,578,498 | B1 | | 6/2003 | Draudt et al. |
| 6,637,117 | B2 | | 10/2003 | Kobayashi |
| 6,763,957 | B1 | | 7/2004 | Mullerleile |
| 6,811,043 | B2 | | 11/2004 | Perkins et al. |
| 6,926,160 | B2 | | 8/2005 | Perkins et al. |
| 6,926,376 | B2 | | 8/2005 | Arent et al. |
| 7,055,703 | B2 | | 6/2006 | Perkins et al. |
| 7,104,023 | B1 | | 9/2006 | Holztrager |
| D532,120 | S | | 11/2006 | Holztrager |
| 7,140,701 | B2 | | 11/2006 | Arent et al. |
| 7,147,115 | B2 | | 12/2006 | Perkins et al. |
| 7,147,290 | B2 | | 12/2006 | Arent et al. |
| 7,228,977 | B2 | | 6/2007 | Perkins et al. |
| 7,296,695 | B2 | | 11/2007 | Perkins et al. |
| D567,615 | S | | 4/2008 | Taniguchi et al. |
| 7,527,156 | B2 | | 5/2009 | Wisnoski et al. |
| 7,591,385 | B2 | * | 9/2009 | Brooks ...................... B25H 3/04 |
| | | | | 211/94.01 |
| D617,583 | S | | 1/2010 | Daino |
| D610,421 | S | | 2/2010 | Taniguchi et al. |
| 7,654,834 | B1 | | 2/2010 | Mier-Langner et al. |
| D611,272 | S | | 3/2010 | Daino |
| 7,669,723 | B2 | * | 3/2010 | Kao ........................... B25H 3/04 |
| | | | | 206/349 |
| D613,520 | S | | 4/2010 | Goodman |
| 7,717,279 | B2 | * | 5/2010 | Lawson ................ A47F 5/0853 |
| | | | | 211/94.01 |
| 7,762,821 | B2 | | 7/2010 | Patterson et al. |
| 7,861,623 | B2 | | 1/2011 | Miyazawa et al. |
| D634,184 | S | | 3/2011 | Koehn |
| 7,975,624 | B2 | | 7/2011 | Henriott |
| D643,704 | S | | 8/2011 | Koehn |
| 7,993,150 | B1 | | 8/2011 | Crow et al. |
| 7,997,212 | B2 | | 8/2011 | Henriott |
| 8,061,864 | B2 | | 11/2011 | Metcalf et al. |
| 8,146,754 | B2 | | 4/2012 | Apgood, II et al. |
| 8,177,311 | B2 | | 5/2012 | Apgood, II et al. |
| 8,205,395 | B2 | * | 6/2012 | Jakiel ..................... A47F 5/0846 |
| | | | | 52/36.5 |
| 8,262,244 | B2 | | 9/2012 | Metcalf et al. |
| 8,267,363 | B2 | | 9/2012 | Begic et al. |
| 8,434,835 | B2 | | 5/2013 | Hardy et al. |
| 8,443,913 | B2 | | 5/2013 | Nagasaka et al. |
| 8,528,871 | B2 | | 9/2013 | Begic et al. |
| 8,573,415 | B2 | * | 11/2013 | Ernst ......................... B25H 3/04 |
| | | | | 248/220.21 |
| 8,684,067 | B1 | * | 4/2014 | Frame .................... H05K 7/1497 |
| | | | | 52/506.03 |
| 8,763,312 | B2 | * | 7/2014 | Carter ................... E04F 13/0894 |
| | | | | 52/36.5 |
| 8,915,609 | B1 | * | 12/2014 | Shah ......................... H05B 45/30 |
| | | | | 362/648 |
| 8,950,077 | B2 | | 2/2015 | Quimby et al. |
| 8,985,813 | B2 | | 3/2015 | Zaderej et al. |
| D732,702 | S | | 6/2015 | Gallien |
| 9,124,308 | B2 | | 9/2015 | Metcalf |
| 9,220,178 | B2 | | 12/2015 | O'Connor et al. |
| 9,301,416 | B2 | | 3/2016 | Zaderej et al. |
| 9,537,275 | B2 | * | 1/2017 | Ewing ...................... A47F 3/001 |

(56) References Cited

U.S. PATENT DOCUMENTS

| | | | |
|---|---|---|---|
| 9,572,424 B2 | 2/2017 | Metcalf | |
| 9,656,398 B2 | 5/2017 | Wang | |
| 9,700,157 B2* | 7/2017 | Keyvanloo | H01R 25/14 |
| 9,701,008 B2 | 7/2017 | Cho | |
| 9,831,642 B2* | 11/2017 | Woodley | A47F 5/0853 |
| 9,847,636 B2* | 12/2017 | Marosi | G06F 1/20 |
| 9,902,589 B2* | 2/2018 | Gregory | B65H 54/585 |
| 9,912,100 B2* | 3/2018 | Zantout | F21V 23/06 |
| 9,986,855 B2* | 6/2018 | Thrush | F16M 13/022 |
| 10,492,631 B2* | 12/2019 | Velderman | H05K 7/1459 |
| 10,925,412 B2* | 2/2021 | Velderman | A47F 5/0846 |
| 11,406,203 B2* | 8/2022 | Velderman | H05K 7/183 |
| 11,737,587 B2* | 8/2023 | Velderman | H05K 7/1457 |
| | | | 211/94.01 |
| 2002/0096545 A1 | 7/2002 | Chang | |
| 2003/0189393 A1 | 10/2003 | Draudt et al. | |
| 2004/0148786 A1 | 8/2004 | Achterberg et al. | |
| 2004/0251227 A1 | 12/2004 | Perkins et al. | |
| 2005/0006539 A1* | 1/2005 | Fischer | A47F 5/0846 |
| | | | 248/220.42 |
| 2006/0104735 A1 | 5/2006 | Zeiler et al. | |
| 2006/0175274 A1* | 8/2006 | Yang | A47F 5/0838 |
| | | | 211/187 |
| 2007/0017886 A1* | 1/2007 | Kao | A47F 7/0028 |
| | | | 211/94.01 |
| 2007/0221594 A1 | 9/2007 | Pierro | |
| 2008/0083514 A1* | 4/2008 | Munson | A47F 5/0846 |
| | | | 160/184 |
| 2008/0105636 A1* | 5/2008 | Lawson | A47F 5/0846 |
| | | | 211/94.01 |
| 2009/0014401 A1* | 1/2009 | Tallman | A47F 5/0846 |
| | | | 211/106.01 |
| 2009/0152944 A1 | 6/2009 | Baine et al. | |
| 2011/0303798 A1 | 12/2011 | Bader et al. | |
| 2013/0107501 A1* | 5/2013 | Ewald | H01R 25/142 |
| | | | 362/145 |
| 2014/0097217 A1 | 4/2014 | Walsh | |
| 2015/0151415 A1 | 6/2015 | Saitou et al. | |
| 2016/0185000 A1 | 6/2016 | Huang | |
| 2016/0190735 A1 | 6/2016 | Zantout et al. | |
| 2016/0205799 A1 | 7/2016 | Zaderez et al. | |
| 2017/0259422 A1 | 9/2017 | Takeyama et al. | |

FOREIGN PATENT DOCUMENTS

| | | |
|---|---|---|
| JP | 2010201512 | 9/2010 |
| JP | 2016203326 | 12/2016 |
| WO | WO20110146794 A2 | 11/2011 |
| WO | 16106183 A1 | 6/2016 |
| WO | 16177795 A1 | 11/2016 |

* cited by examiner

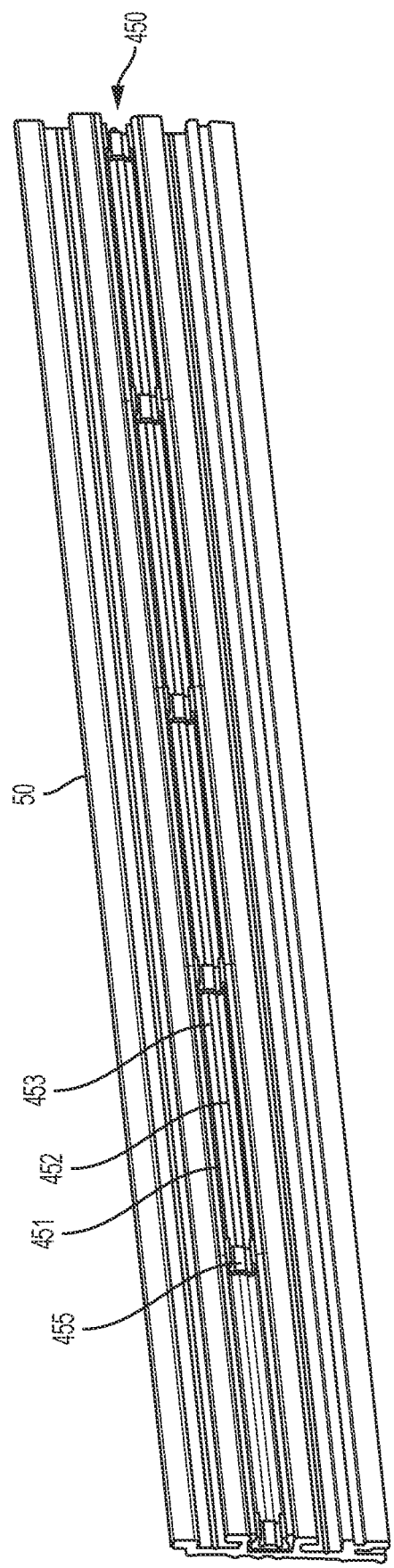
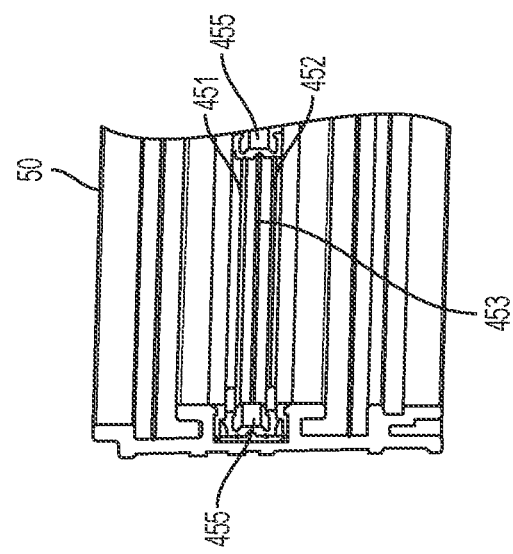
FIG. 30
FIG. 31

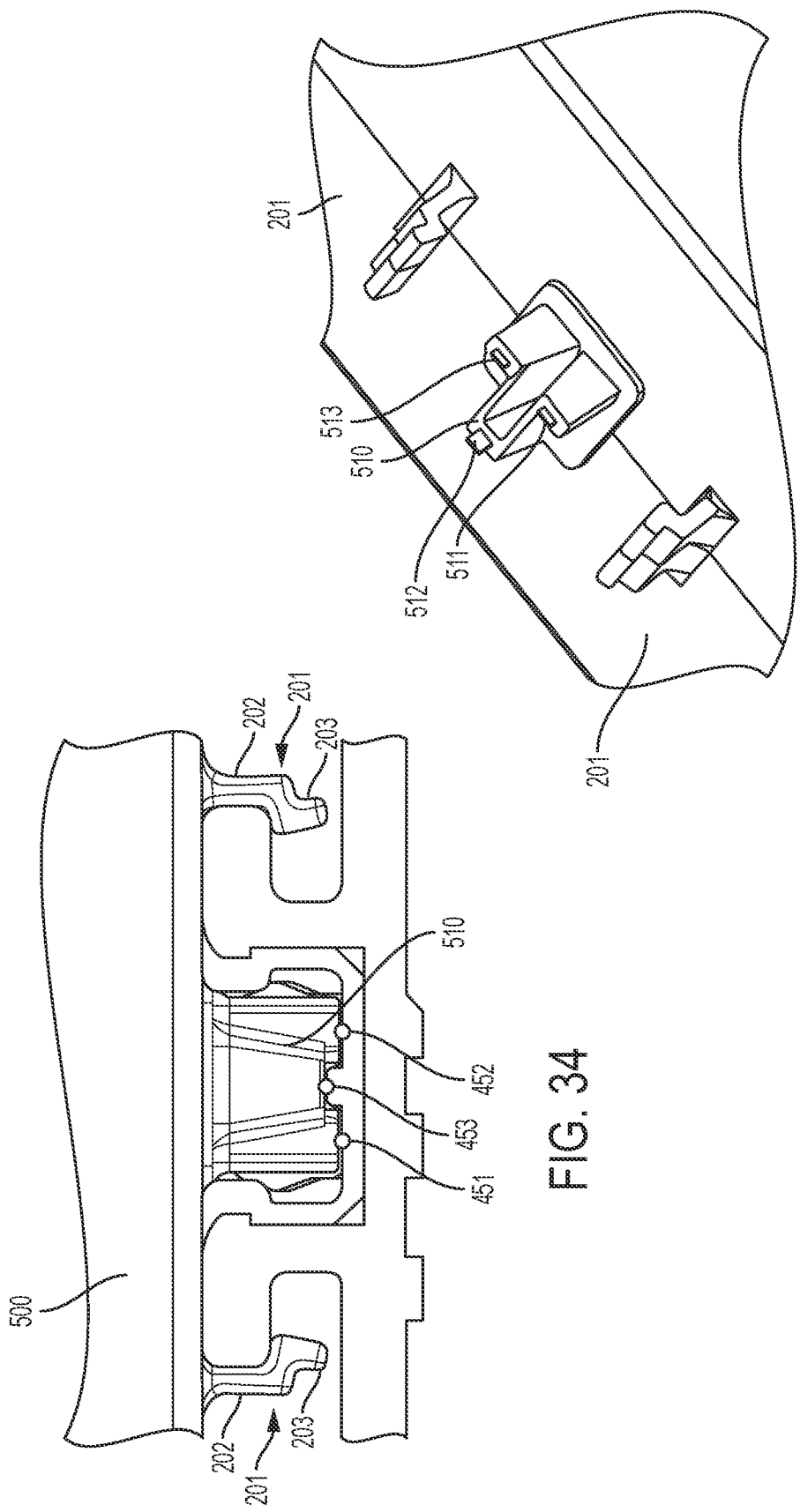

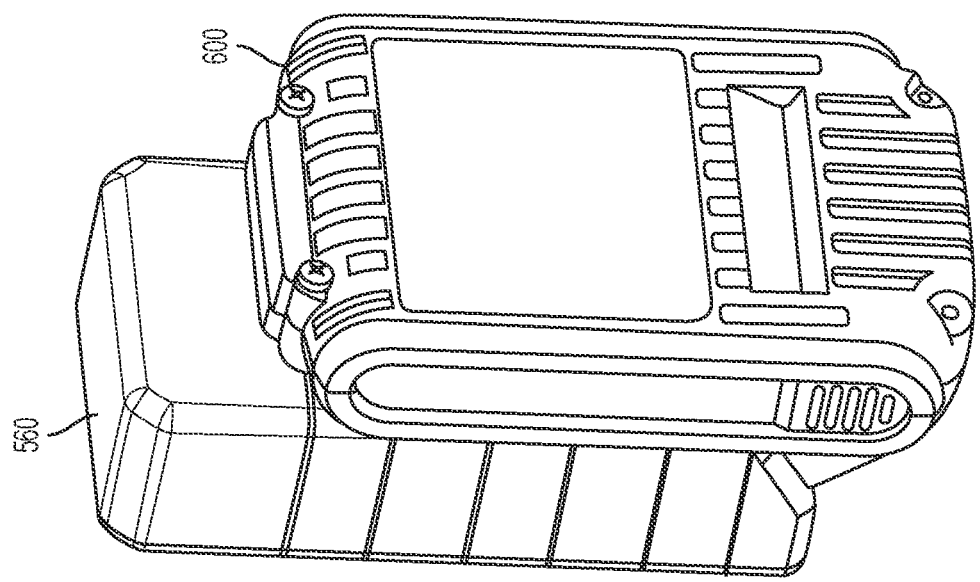
FIG. 45
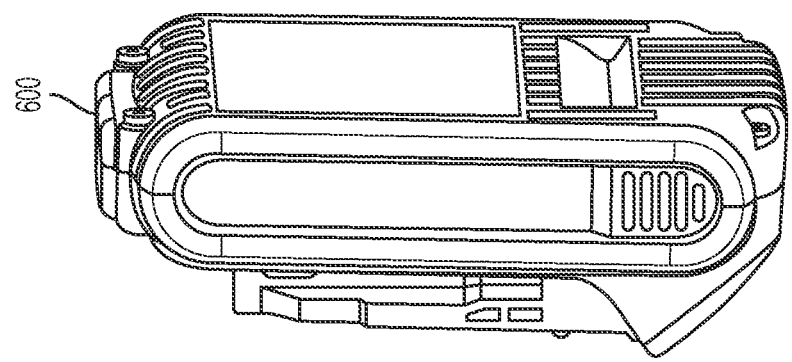
FIG. 44
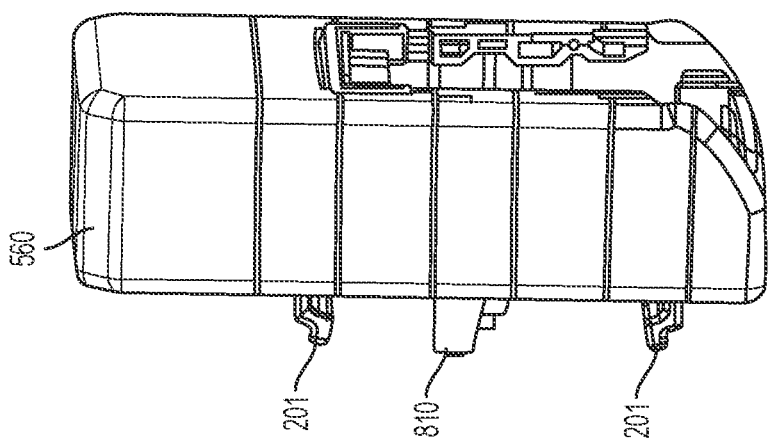

WALL HANGING SYSTEM

CROSS-REFERENCE TO RELATED APPLICATION

This application is a continuation application of U.S. application Ser. No. 17/859,145 filed on Jul. 7, 2022, which is a continuation application of U.S. application Ser. No. 17/150,295 filed on Jan. 15, 2021, which is a continuation of U.S. application Ser. No. 16/668,988 filed on Oct. 30, 2019, which is a continuation application U.S. application Ser. No. 15/946,248 filed on Apr. 5, 2018, which claims the benefit of U.S. Provisional Application No. 62/544,962 filed on Aug. 14, 2017, entitled Wall Hanging System; and U.S. Provisional Application No. 62/540,210 filed on Aug. 2, 2017; and U.S. Provisional Application No. 62/532,077 filed on Jul. 13, 2017. The entire contents of all of the above are incorporated herein by reference.

FIELD OF THE INVENTION

The present application relates to a system for the hanging and storage of items, such as tools, on a wall.

BACKGROUND

It is desired to provide wall hanging system which effectively provides storage.

SUMMARY

According to an aspect of an exemplary embodiment, there is a wall panel system. The wall panel system includes a first wall panel, the first panel including at least a first panel hook portion; and a second wall panel having a different configuration than the first wall panel, the second panel including at least a second panel hook portion and a third panel hook portion opposing the second panel hook portion. The first wall panel is configured to engage with the second wall panel to create a wall panel assembly.

The first panel hook portion may project in the same direction as the second panel hook portion.

The wall panel system may further include a third wall panel, having a different configuration than the first wall panel and the second wall panel, the third wall panel including a fourth panel hook portion.

The third wall panel may be configured to engage with the first wall panel or the second wall panel.

The third wall panel may include a groove and a power strip in the groove.

The wall panel system may further include a first hook configured to hang on the first panel hook portion, the second pane hook portion and the fourth panel hook portion.

The fourth panel hook portion may project in the same direction as the first panel hook portion.

The first wall panel and the second wall panel may each include a connector portion and a connector receiving portion.

The connector receiving portion may be configured to receive the connector portion so as to engage the first wall panel to the second wall panel.

The first wall panel, the second wall panel and the third wall panel may each include a connector portion and a connector receiving portion.

The connector receiving portion may be configured to receive the connector portion.

The wall panel system may further include a cabinet.

The cabinet may include at least one groove

The connector portion fits into the at least one groove.

According to another aspect, there is a securing member and wall panel assembly which includes a wall panel and a securing member. The wall panel includes a lower panel hook portion and an upper panel hook portion. The securing member includes a panel abutting member and a latch member, the latch member movable relative to the panel abutting member to unlock the securing member from the wall panel.

The panel abutting member may include an upper section, a lower section and a central section connecting the upper section and the lower section.

The upper section may be generally parallel to the lower section.

The central section may be generally perpendicular to the upper section.

The central section may be generally perpendicular to the lower section.

The latch member may include a gripping member, a latching portion and an attachment member.

The attachment member of the latch member may be fixedly attached to the panel abutting member.

The attachment member may be fixedly attached to the lower section of the panel abutting member.

The gripping member may be configured to rotate upon force from a user and unlock the securing member from the panel.

In a locked position, the lower section of the panel abutting member may abut a front side of the lower panel hook and the latching portion abuts a rear side of the lower panel hook so as to secure the securing member on the panel.

In the locked position, the upper section of the panel abutting member may abut a rear side of the upper panel hook.

In the locked position, the central section of the panel abutting member may abut an upper side of the lower panel hook, the upper side of the lower panel hook being generally perpendicular to the rear side of the lower panel hook.

The securing member and wall panel assembly may further include a tool holding hook projecting from the lower section of the panel abutting member.

According to another aspect, there is an exemplary embodiment of a clip and wall panel assembly including a wall panel and a clip. The wall panel includes a first panel hook portion and a second panel hook portion. The clip includes a base portion and a pair of legs at opposite ends of the base portion, each of the legs configured to latch over the first panel hook portion or the second panel hook portion. Each leg includes a base portion and a finger portion, the finger portion being angled with respect to the base portion. The legs are flexible such that a first leg of the pair of legs can snap behind the first panel hook portion and the second leg of the pair of legs can snap behind the second panel hook portion to secure the clip to the wall panel.

The wall panel may include a central groove.

When the clip is secured to the wall panel, it may cover a portion of the central groove.

The clip and wall panel assembly may further include a battery charger, the battery charger secured to the wall panel.

The clip and wall panel assembly may further include a power strip secured to the wall panel.

The battery charger may include a power cord which passes under the clip so that the cord is secured in the central groove.

The power strip may include a power cord which passes under the clip so that the cord is secured in the central groove.

According to another aspect, there is an exemplary embodiment of a clip and wall panel assembly. The assembly includes a wall panel, the wall panel including a first panel hook portion, a second panel hook portion and a groove. The assembly further includes a plurality of clips, each clip including a base portion and a pair of legs at opposite ends of the base portion, each of the legs configured to latch over the first panel hook portion of the second panel hook portion. Each leg includes a base portion and a finger portion, the finger portion being angled with respect to the base portion. At least one of the plurality of clips is attached to a battery charger and secures the battery charger to the wall panel. At least one of the plurality of clips is attached to a power strip and secures the power strip to the wall panel. The battery charger may include a cord. The cord may extend from the battery charger in the central groove to the power strip. At least one of the plurality of clips may be attached to the wall panel and secures the cord in the central groove.

According to another aspect, there is an exemplary embodiment of a wall panel system. The wall panel system includes a wall panel, the wall panel including at least one hook and a groove, an insert in the groove, the insert including at least one conductor. The wall panel system also includes power supply device which provides electricity to the at least one conductor and a power receiving device which receives electricity from the at least one conductor.

The power receiving device may be at least one of a battery charger, a light, a fan and an electrical outlet.

The at least one conductor may be a positive rail and a ground rail.

The power supply device may receive power from at least one of a battery pack, an AC power source and a solar power source.

The power supply device may be configured to receive power from at least one of a power tool battery pack and an AC power source.

The power supply device may be configured to receive power form at least one of a power tool battery pack and a solar power source.

The at least one conductor may be three conductors.

The three conductors may run parallel to one another.

Two of the three conductors may be positively charged conductors.

The conductors may include copper.

The conductors may be made of metal.

The wall panel may be plastic.

According to another aspect, there is an exemplary embodiment of a wall panel system which includes a wall panel, the wall panel having a longitudinal axis and including at least one hook and a groove. The wall panel also includes at least one hook which is selectively engageable with the wall panel and is configured to hold one or more items. The wall panel system also includes at least one conductor, a power supply device which provides electricity to the at least one conductor and a power receiving device which receives electricity from the at least one conductor.

The at least one conductor may run along a length of the wall panel.

The at least one conductor may be on or parallel to the longitudinal axis.

The power receiving device may include at least one of a battery charger, a light, a fan and an electrical outlet.

The at least one conductor may include a positive rail and a ground rail.

The power supply device may receive power from at least one of a battery pack, an AC power source and a solar power source.

The power supply device may be configured to receive power from at least one of a power tool battery pack and an AC power source.

The power supply device may be configured to receive power form at least one of a power tool battery pack and a solar power source.

The at least one conductor may be three conductors.

The three conductors may run parallel to one another.

Two of the three conductors may be positively charged conductors.

The conductors may include copper.

The conductors may be made of metal.

The power supply device may include a control box.

The control box may include a power supply connector which at least one pin configured to engage the at least one conductor.

The control box may include an AC/DC converter for converting an AC power supply to a DC power supply.

The control box may output a DC power supply to the at least one conductor.

The control box may include a controller.

The control box may include a circuit for measuring a voltage of the at least one conductor.

The control box may include a circuit for measuring a current of the at least one conductor.

The control box may be removably attached to the wall panel.

The control box may include clips for removably attaching to the wall panel.

According to another aspect, three is a wall panel. The wall panel includes a first hook portion and a second hook portion. The first hook portion may face in a direction opposite the second hook portion.

The wall panel may include a connector portion and a connector receiving portion, the connector receiving portion configured to receive a connector portion of another wall panel.

The connector receiving portion may overlap with one of the hook portions.

The wall panel may further include a spacing projection adjacent to the connector portion.

The spacing projection may project generally perpendicularly to the connector portion.

BRIEF DESCRIPTION OF THE DRAWINGS

FIG. 30 is a perspective view of the wall panel assembly of the exemplary embodiment;

FIG. 31 is a close-up perspective view of an end of the wall panel assembly system of the exemplary embodiment;

FIG. 34 is a side view of the control box and wall panel according to the exemplary embodiment;

FIG. 35 is a rear perspective view of a portion of the control box according to the exemplary embodiment;

FIG. 44 is a perspective view of a battery charger and battery pack according to an exemplary embodiment;

FIG. 45 is another perspective view of a battery charger and battery pack according to an exemplary embodiment;

DETAILED DESCRIPTION OF EXEMPLARY EMBODIMENTS

Figure 1:
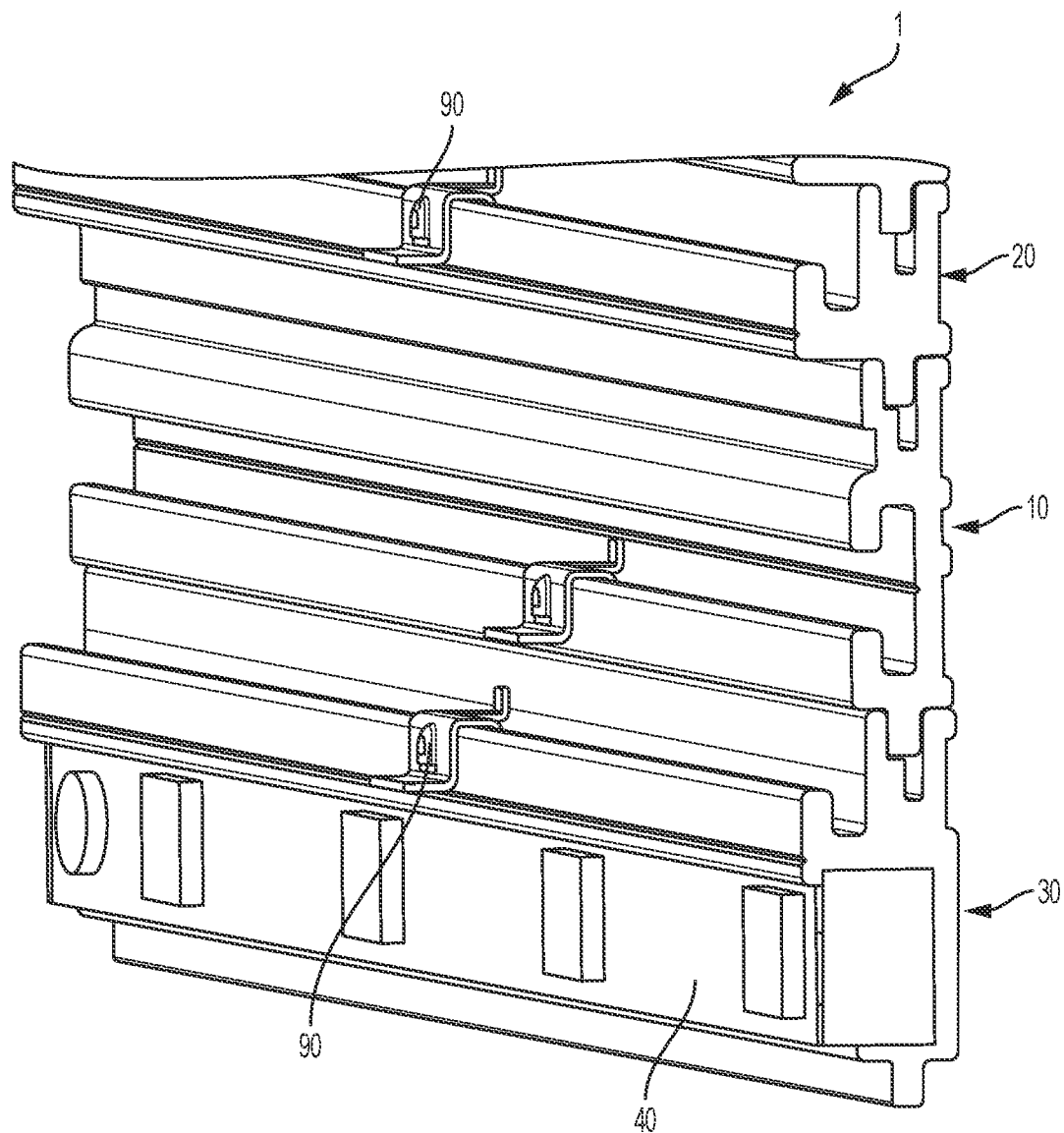
FIG. 1 is a perspective view of a wall hanging system according to an exemplary embodiment.
Figure 2:
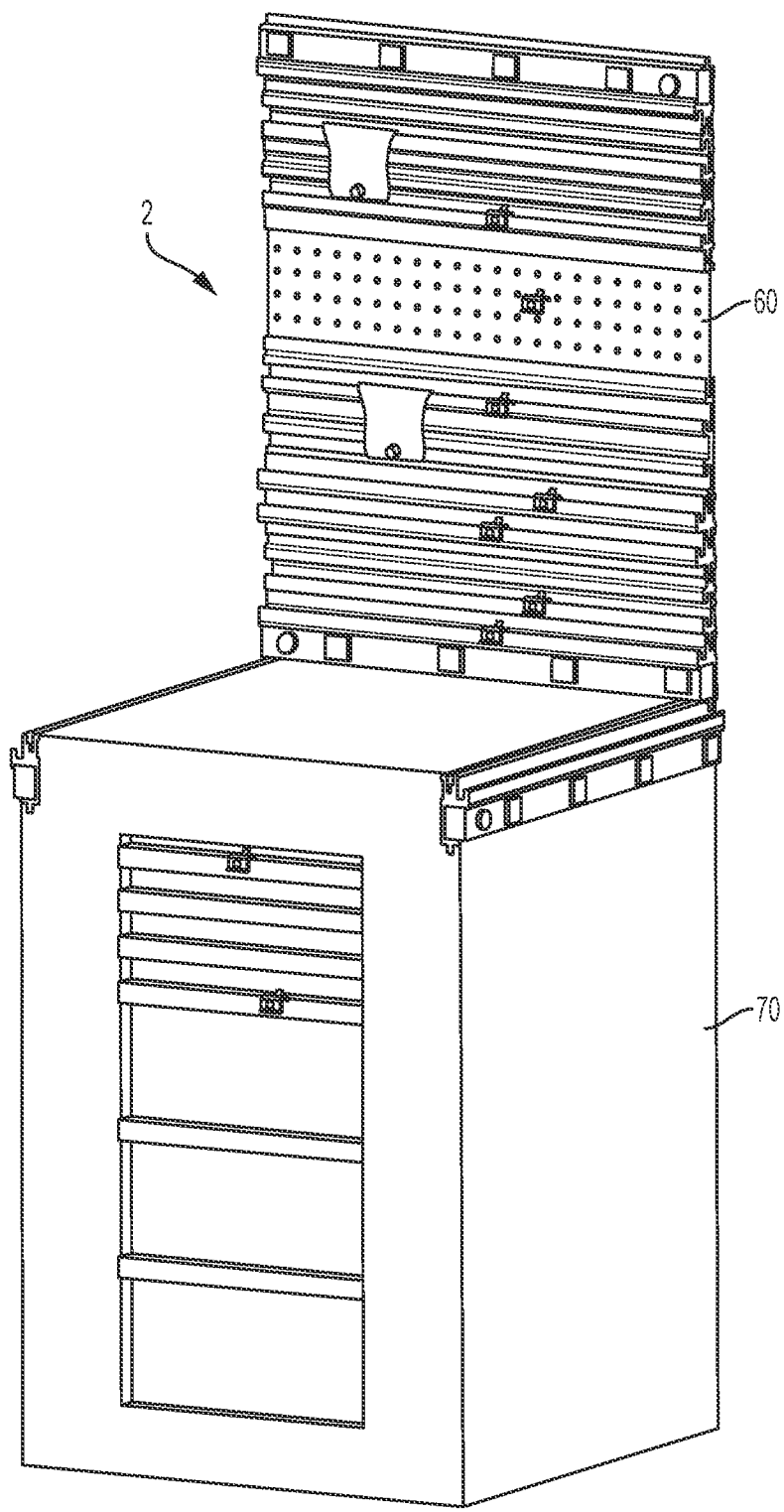
FIG. 2 is a perspective view of a wall hanging system and cabinet according to an exemplary embodiment.

FIG. 1 illustrates a perspective view of a wall hanging assembly 1. The wall hanging assembly 1 includes a number of different panels of different design. Particularly, the wall hanging assembly 1 includes first panel 10, second panel 20 and third panel 30. As shown in FIG. 1, each of these panels 10, 20, 30 may be connected to other panels of the same or different type. The panels 10, 20, 30 may also be connected to a pegboard 60 and a cabinet 70, as shown in FIG. 2 and discussed in further depth below.

Figure 5:
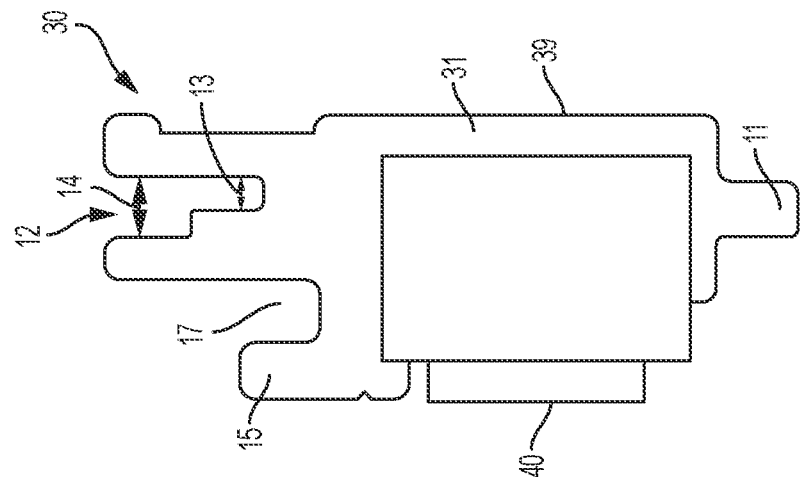
FIG. 5 is a side view of a third wall panel according to an exemplary embodiment.
Figure 4:
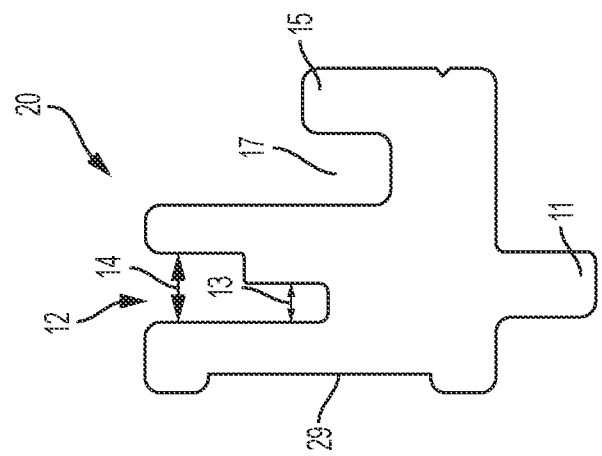
FIG. 4 is a side view of a second wall panel according to an exemplary embodiment.
Figure 3:
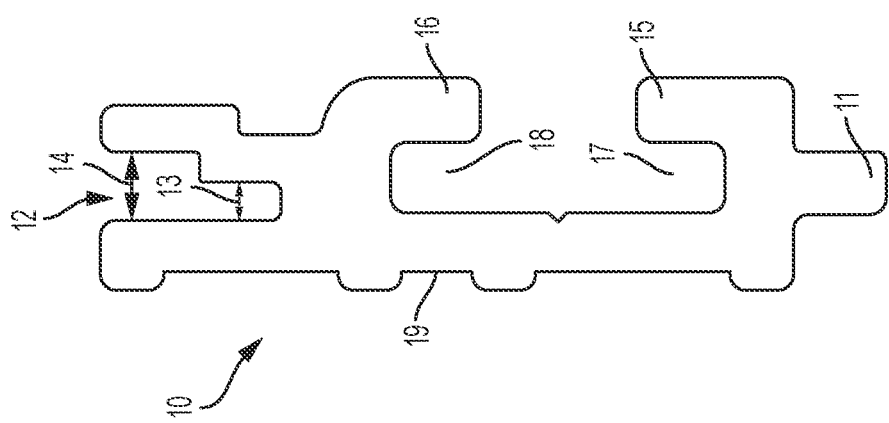
FIG. 3 is a side view of a first wall panel according to an exemplary embodiment
Figure 6:
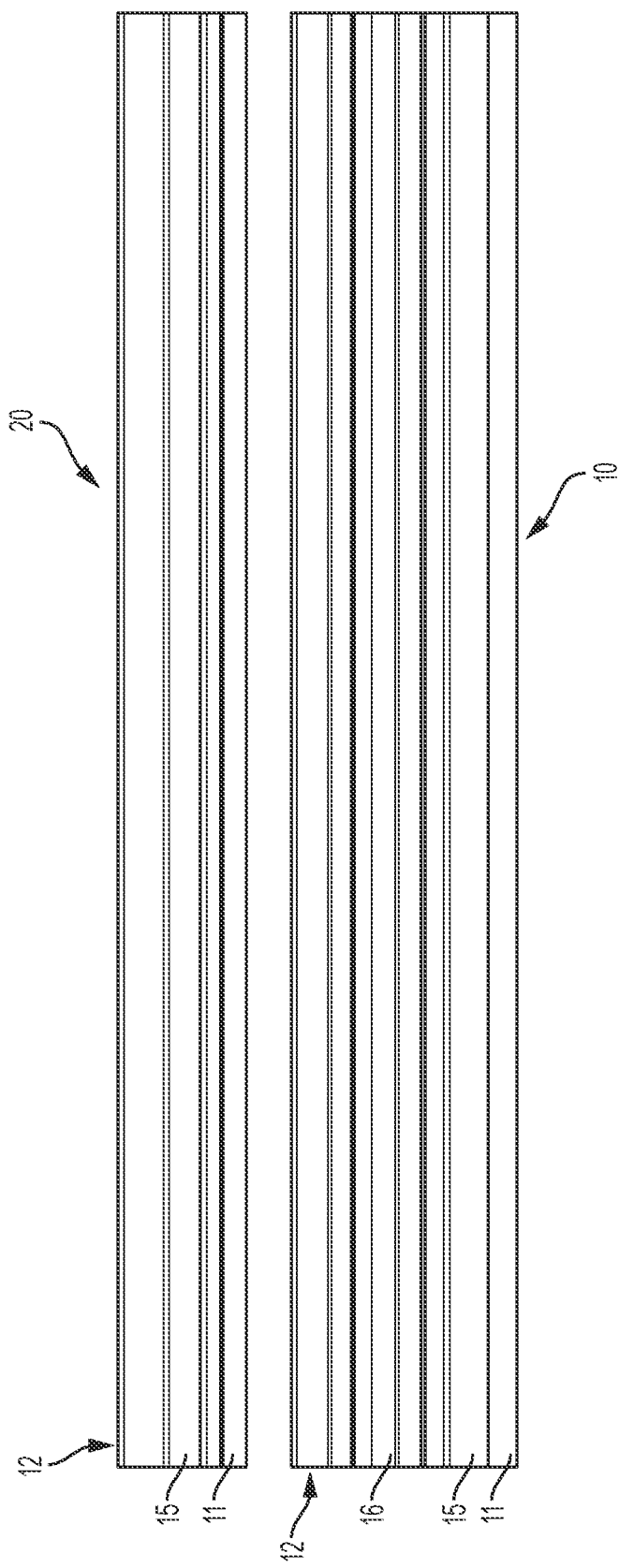
FIG. 6 is a front view of first and second wall panels according to the exemplary embodiment.
Figure 7:
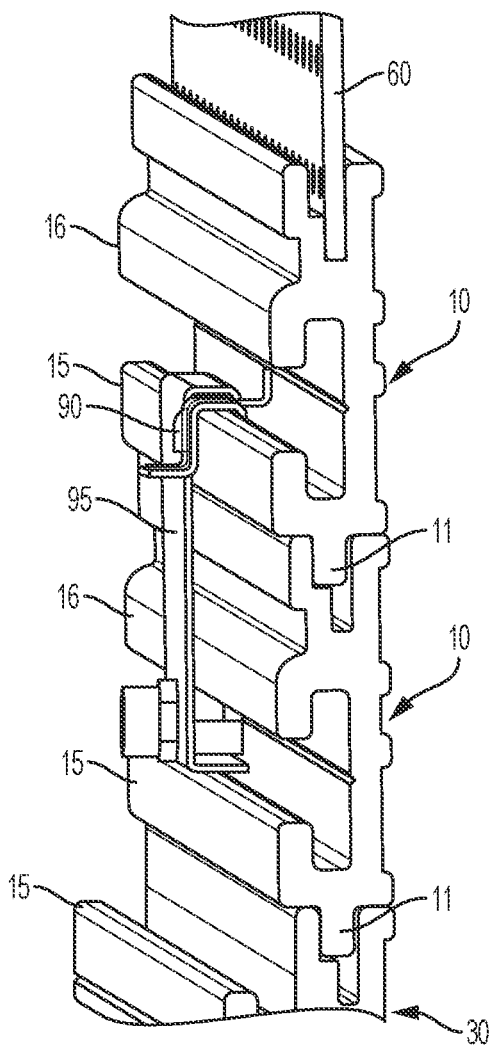
FIG. 7 is a side perspective view of a wall panel and pegboard assembly according to the exemplary embodiment.
Figure 8:
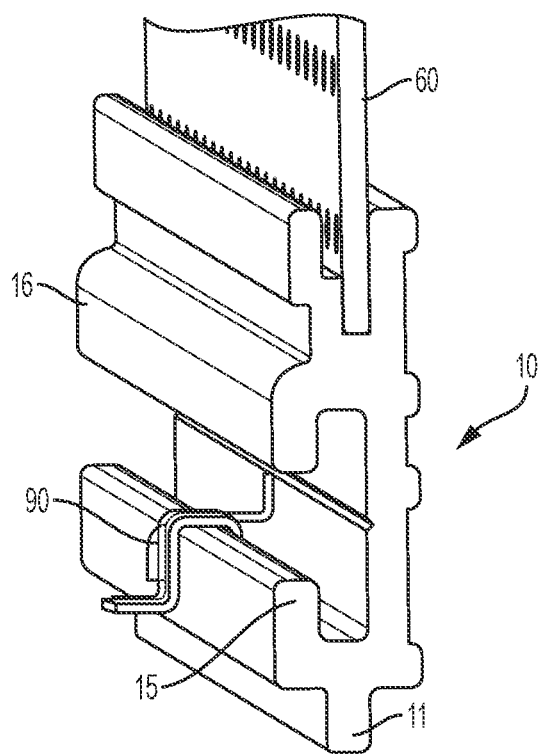
FIG. 8 is a side perspective view of a wall panel and pegboard assembly according to the exemplary embodiment.
Figure 9:
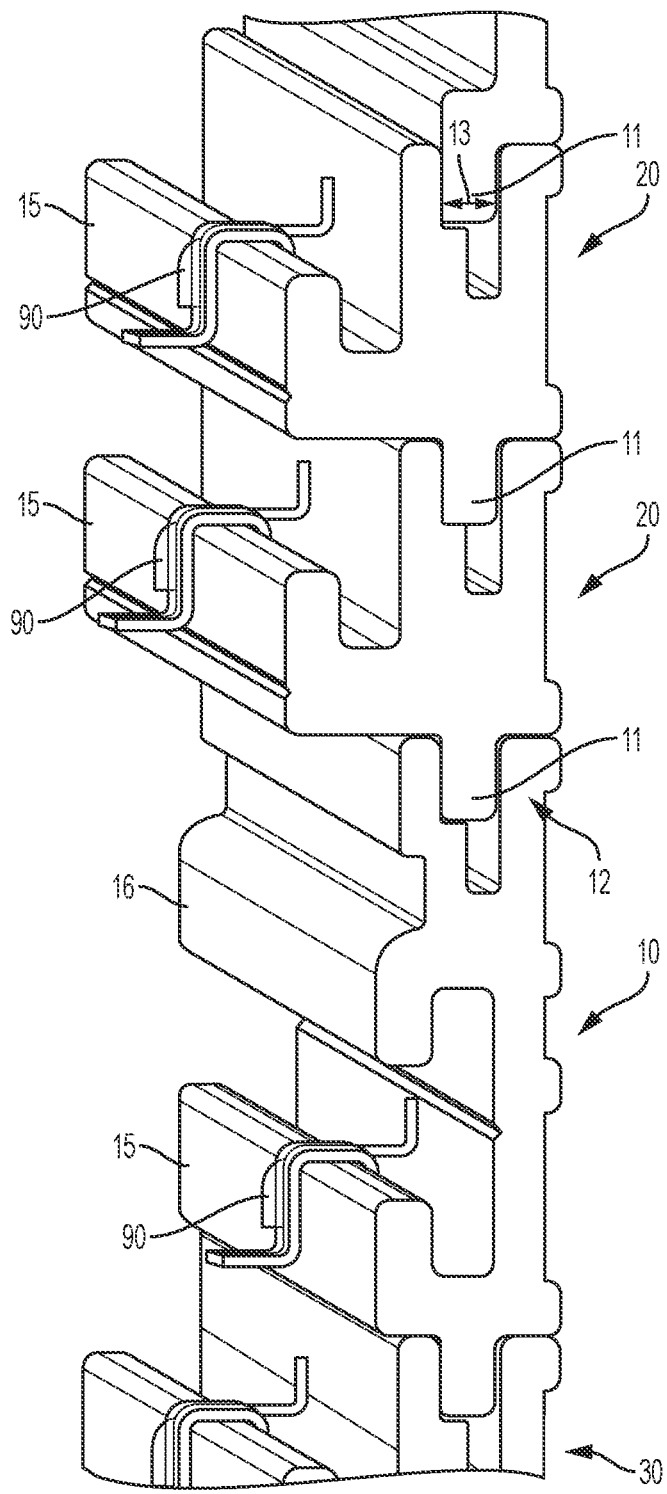
FIG. 9 is a side perspective view of a wall panel and pegboard assembly according to the exemplary embodiment.
Figure 10:
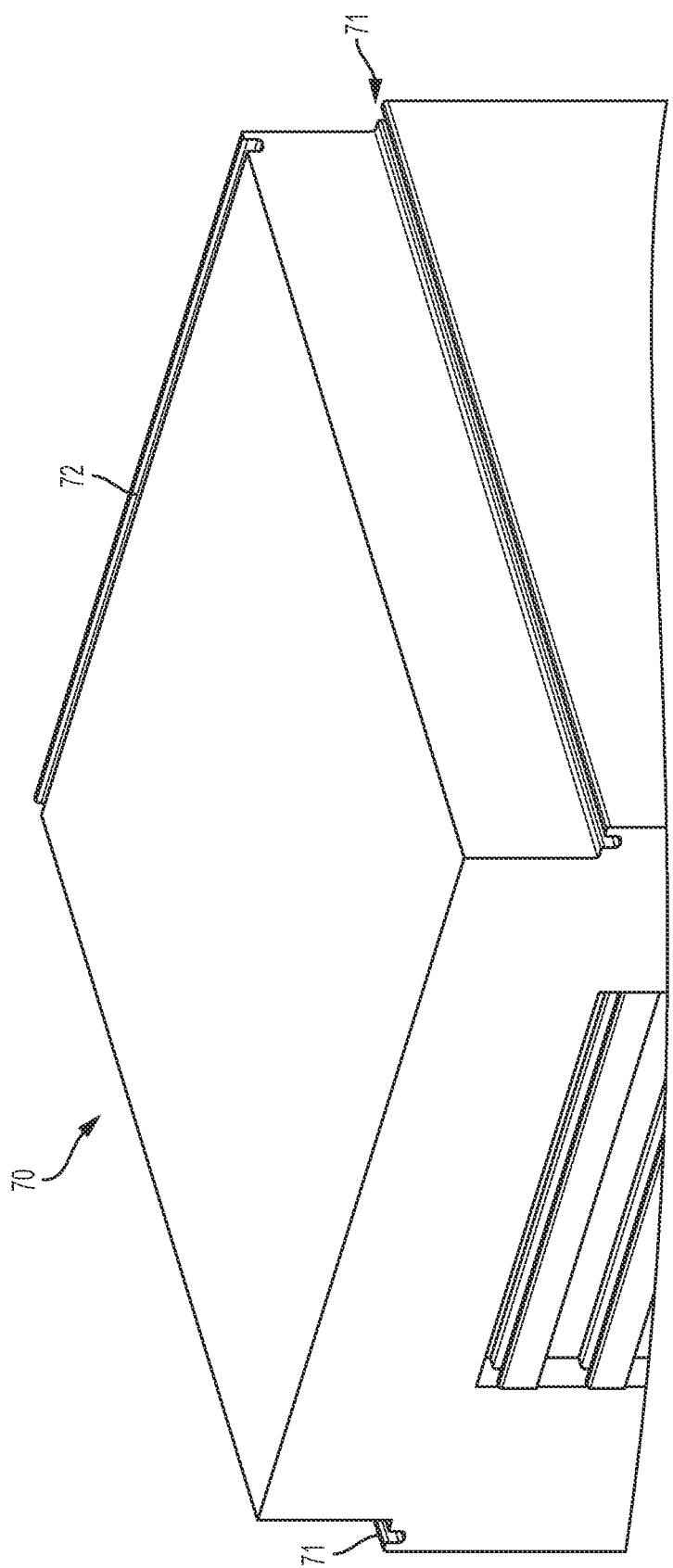
FIG. 10 is a top perspective view of a cabinet according to an exemplary embodiment.

Details of the panels 10, 20 and 30 will be discussed with reference to FIGS. 3-9 and FIG. 1. FIG. 3 is a side view of the first panel 10, FIG. 4 is a side view of the second panel 20 and FIG. 5 is a side view of the third panel 30. Additionally, FIG. 6 illustrates front views of the first panel 10 and the second panel 20. FIGS. 7-9 illustrate various assemblies including the panels 10, 20, 30.

As shown in FIGS. 3-5, each of the panels 10, 20, 30 include a connector portion 11 at their lower end. Each of the panels also include a connector receiving portion 12. The connector receiving portions 12 are located at the top end of the panels 10, 20, 30. The connector portions 11 and the connector receiving portions 12 are sized and shaped so that the connector portions 11 fit into the connector receiving portions 12. This allows multiple panels to be connected together as shown in, for example, FIGS. 1 and 7-9.

The panels 10, 20, 30 can be connected to other panels of the same type or to panels of a different type. That is, a first panel 10 can be connected to one or more other first panels 10. The first panel 10 can also be connected to one or more of the second panels 20 and third panels 30. For example, FIG. 7 illustrates two first panels 10 being connected in sequence. FIG. 9 illustrates a first panel 10 being connected to a second panel 20 and a third panel 30. The panels 10, 20, 30 may also be connected to panels of the type shown in U.S. Pat. No. 8,528,871, which is hereby incorporated by reference.

The connector receiving portions 12 include two different width openings. The smaller width is a peg board opening 13 and the larger width is a panel opening 14. As shown in FIGS. 7 and 8, the peg board opening 13 has a width corresponding to a peg board 60 and can accommodate a peg board 60. The panel opening 14 has a width corresponding to the width of the panel connector portions 11.

With reference to FIG. 3, the first panel 10 includes a lower panel hook 15 and an upper panel hook 16. A space 17 is formed behind the lower panel hook 15 and a space 18 is formed behind the upper panel hook 16. As shown in FIG. 4, the second panel 20 is smaller than the first panel 10. The second panel 20 only includes a lower panel hook 15 and the corresponding space 17. The third panel 30, shown in FIG. 5, includes a lower panel hook 15 and the corresponding space 17. As with the second panel 20, the third panel 30 does not include an upper panel hook 16. As shown in FIGS. 1 and 5, for example, the third panel 30 includes a slot 31 for receiving a power strip 40. The power strip 40 includes a number of outlets for receiving plugs, as is well known. The power strip 40 may be a removable part which can be inserted or removed from the slot 31 or it may be integral or fixedly connected in the third panel 30.

As shown in FIGS. 7-9, the panels can receive a hook 90 or 95. As shown in FIGS. 7-9, the hooks 90 fit over the lower panel hooks 15 of the panels. The hook 95 is an extended hook. As shown in FIG. 7, an upper end of hook 95 fits over a lower panel hook 15 and a lower end of the hook 95 fits under an upper panel hook 16.

Each of the panels have rear surfaces, as shown in FIGS. 3-5. The first panel 10 has a rear surface 19, the second panel 20 has a rear surface 29 and the third panel 30 has a rear surface 39. The rear surfaces are intended to abut against a wall. The panels 10, 20, 30 can be attached to walls through the use of a screw or other fastener or attachment means. Typically, the panels 10, 20 30 would be screwed to a wall at a stud, however, other attachment means or locations are possible. For example, in an assembly with a cabinet 70, the wall panels may connect with the cabinet 70 and simply rest against a wall.

Figure 11:
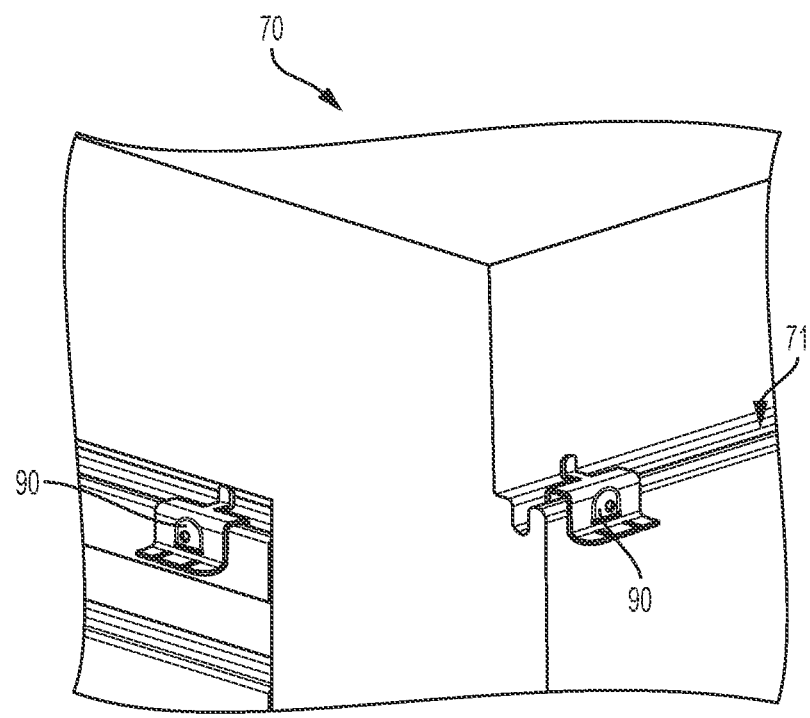
FIG. 11 is a close up perspective view of the cabinet according to the exemplary embodiment.
Figure 12:
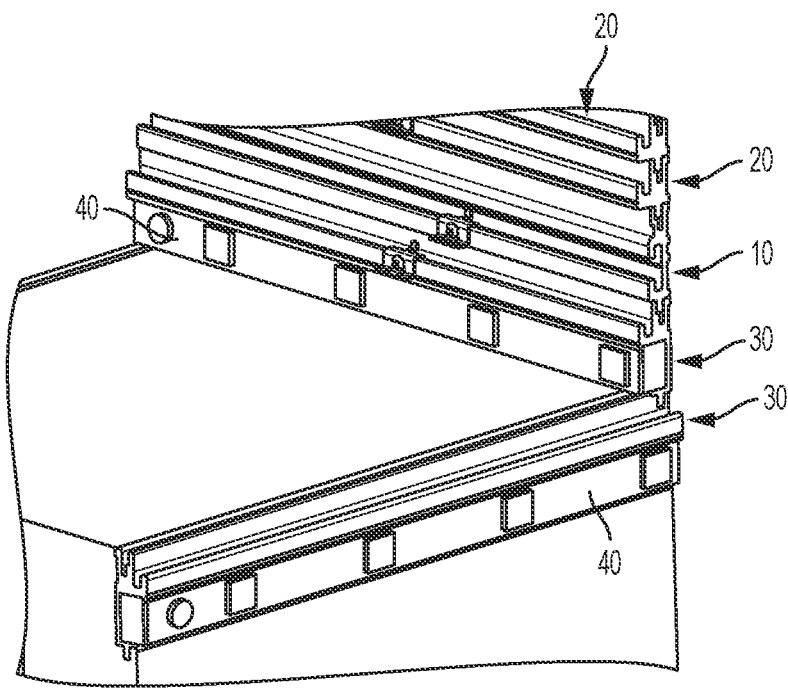
FIG. 12 is a close up perspective view of a cabinet and wall panel assembly according to the exemplary embodiment.
Figure 13:
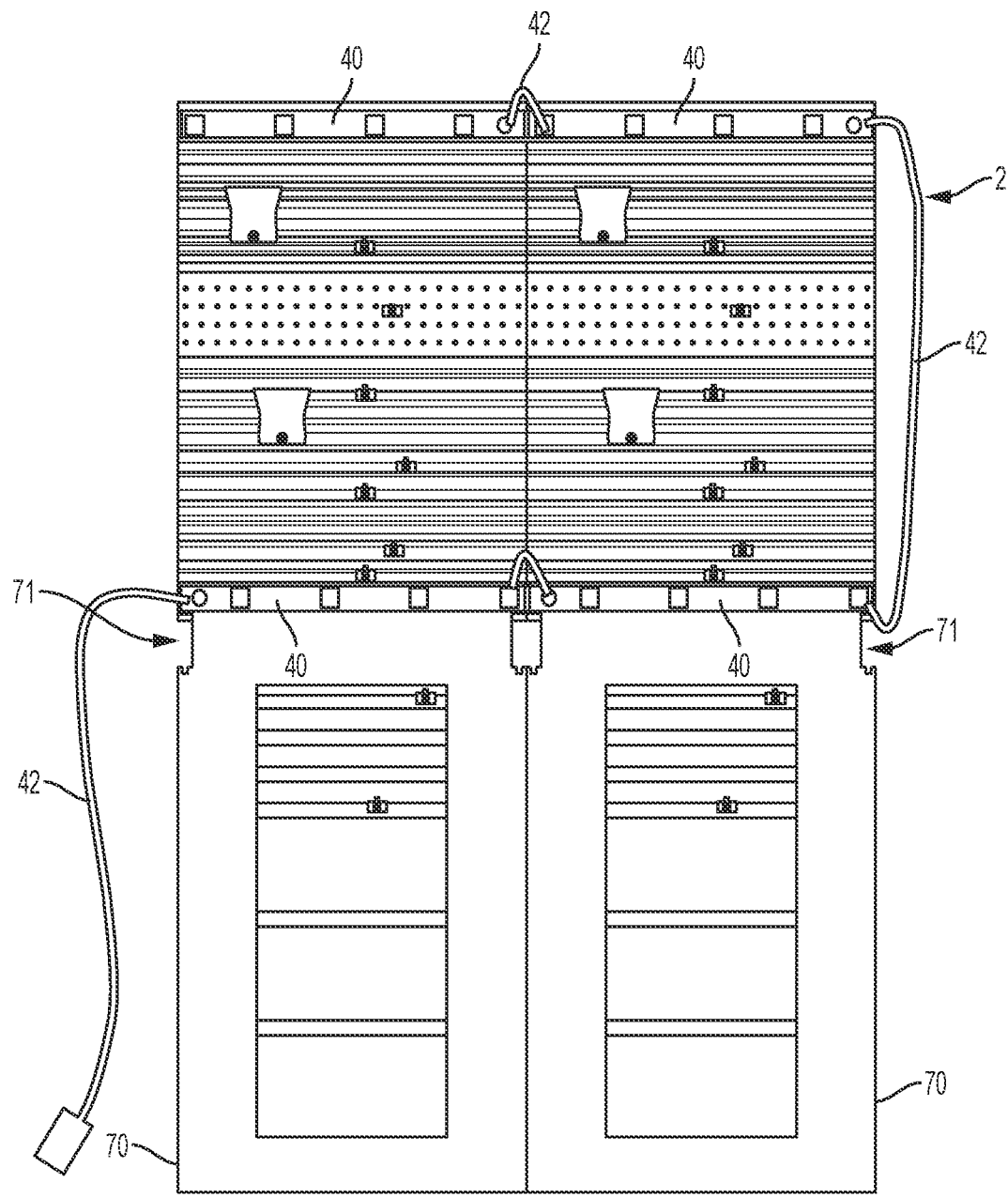
FIG. 13 is a front view of a cabinet and wall panel assembly according to an exemplary embodiment.

As shown in FIGS. 10-13, the cabinet 70 of the exemplary embodiment is configured to be integrated with the panels 10, 20, 30. The cabinet 70 has a pair of side receivers 71 and a rear slot 72. As shown in FIG. 11, the side receiver 71 has a cabinet hook 75 with the same dimensions as the lower panel hook 15, described above. The cabinet hook 75 can receive the hook 90, as shown. Additionally, as shown in FIG. 12, the side receiver 71 can also receive a panel, such as the third panel 30. This allows a power strip 40 to be attached to the cabinet 70. As also shown in FIGS. 12 and 13, the rear slot 72 is able to receive one or more panels 10, 20, 30. Accordingly, as shown in FIG. 13, a combination cabinet 70, wall panel and peg board system can be provided. As shown in FIG. 13, multiple power strips 40 may be plugged into one another so that only a single power strip 40 needs to be plugged into the wall.

Figure 17:
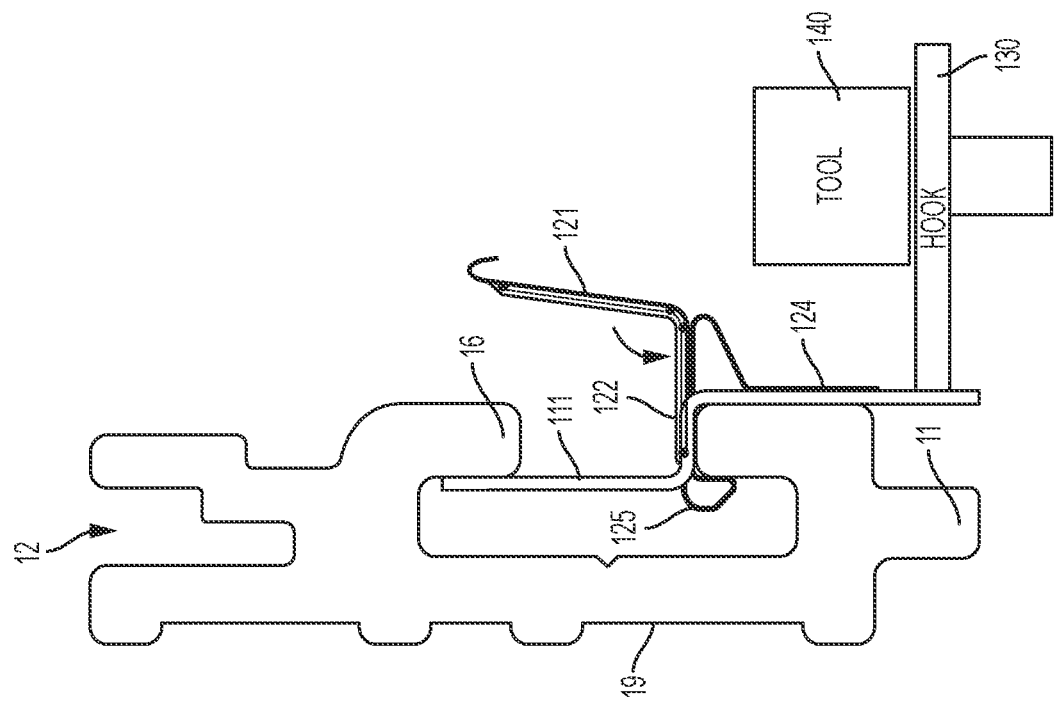
FIG. 17 is another side view of the securing member and a wall panel according to the exemplary embodiment.
Figure 18:
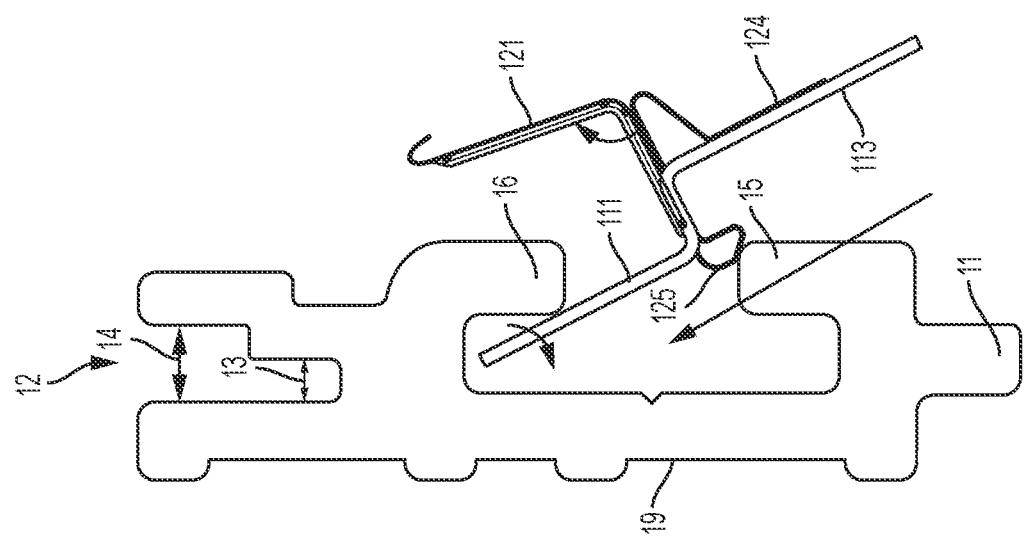
FIG. 18 is another side view of the securing member and a wall panel according to the exemplary embodiment.

FIGS. 14-20 illustrate a securing member 100 which can be used with the first panel 10 to hang a tool or other device on the wall. The securing member 100 is able to be secured to or removed from the panel 10 and a variety of different hooks may be secured to the securing member 100 to hold tools of various types. A tool holding hook 130 is shown in FIG. 18. In other embodiments, the multiple hooks, projections or other types of holders may be used with the securing member 100. The hooks, projections or other holders may be integrally formed with the securing member 100 or may be attached to the securing member 100 by any of a variety of means, such as an adhesive, welding or fasteners. The securing member 100 may also be attached directly to tools or other objects. For example, a light may be directly attached to the securing member 100 so that the light can be secured to one of the first panels 10.

Figure 15:
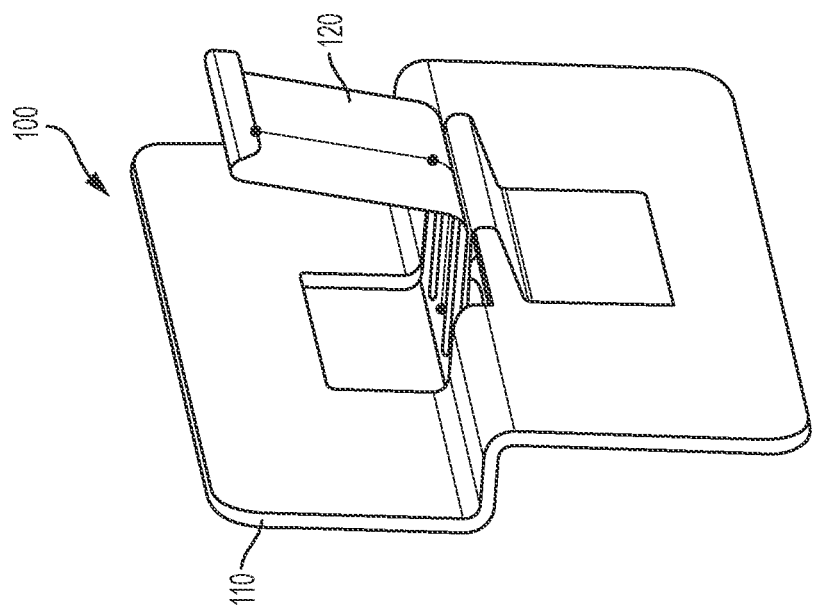
FIG. 15 is a perspective view of the securing member according to the exemplary embodiment.
Figure 14:
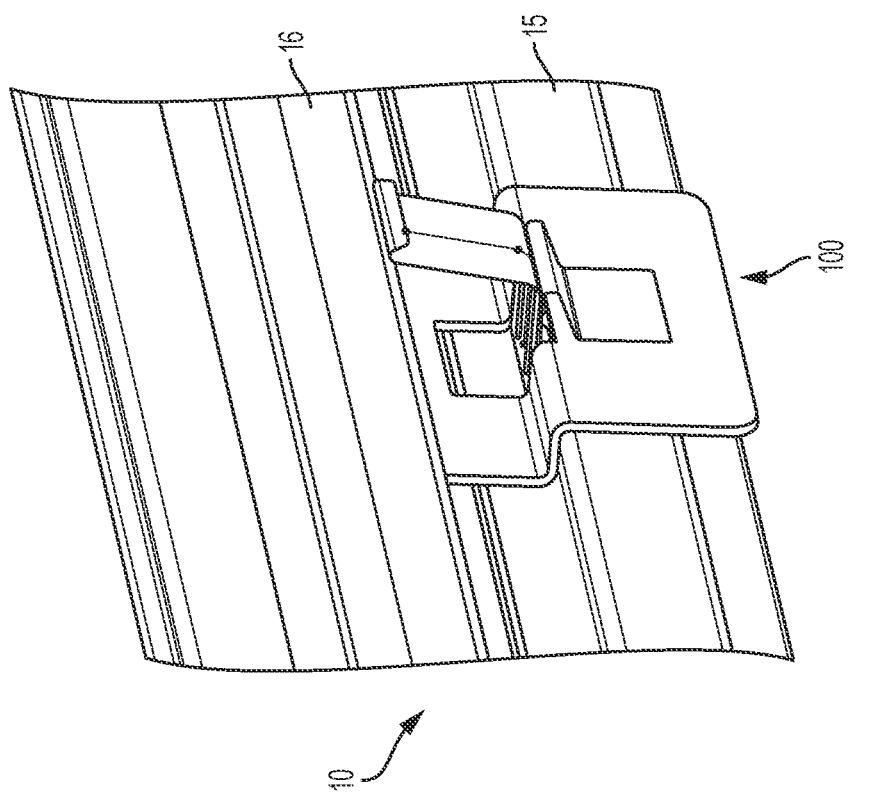
FIG. 14 is a perspective view of a securing member and wall panel according to an exemplary embodiment.
Figure 16:
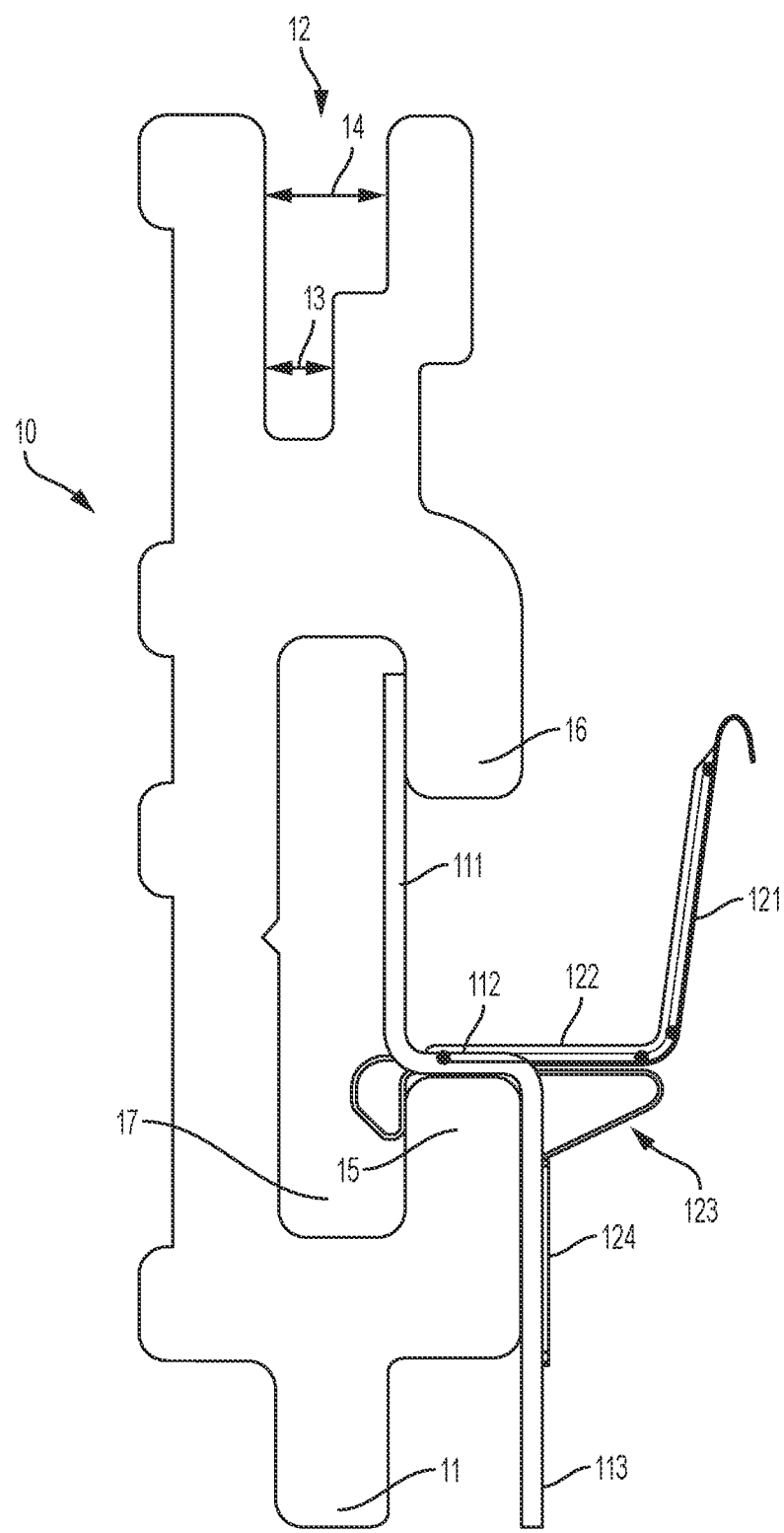
FIG. 16 is a side view of the securing member and a wall panel according to the exemplary embodiment.

FIG. 14 is a perspective view of the securing member 100 attached to a panel 10 and FIG. 15 illustrates the securing member 100 alone. The securing member 100 of the exemplary embodiment is made of two main parts. The first part is a panel abutting member 110. The panel abutting member 110 is relatively rigid and abuts portions of the panel 10. The second part is the latch member 120. The latch member 120 pivots and latches to the panel 10, as will be explained in further detail below.

The panel abutting member 110 includes an upper section 111, a central section 112 and a lower section 113. The latch member 120 includes a gripping member 121, a central member 112 a spring member 123 and a lower/attachment member 124. The spring member 123 includes a latching portion 125, which latches over the lower channel hook 15.

The latch member 120 is attached to the panel abutting member 110 at the panel abutting member lower section 113. In particular, the attachment member 124 of the latch member 120 is attached to the lower section 113. In the exemplary embodiment, the attachment member 124 is welded to the lower section 113 of the abutting member 110. Other attachment methods including, but not limited to, adhesives, fasteners or crimping could also be used.

Operation of the securing member 100 can be seen in FIGS. 17-20. In FIG. 17, the securing member 100 is inserted into the panel 10. As shown, the upper section 111 is inserted behind the upper panel hook 16 into the space 17 such that the latching portion 125 abuts against the lower panel hook 15. The user then pushes the securing member 100 towards the rear 19 of the panel 10 (i.e., to the left in FIG. 17). The latching portion 125 is able to deflect and slides over the lower panel hook 15 until the securing member 100 reaches the position shown in FIG. 18.

FIG. 18 shows the securing member 100 in an attached position where it is attached to the panel 10 and including a hook 130 which holds a tool 140. The tool may be a screwdriver, wrench, power tool or other tool, for example.

As shown in FIG. 18, the latching portion 125 wraps around a rear side of the lower panel hook 15. Additionally, the central portion 112 of the abutting member 110 is on a top surface of the abutting member and the lower section 113 of the abutting member 110 is on the front side of the lower panel hook 15. This sandwiches the lower panel hook 15 between the latching portion 125 and lower section 113.

The upper section 111 of the abutting member 110 serves to further secure the securing member 100 to the panel 10. As shown in FIG. 18, when the securing member 100 is inserted into the panel 10, the upper section 111 contacts a rear side of the upper panel hook 16. This secures the securing member 100 in a second direction and helps the securing member 100 resist being pulled away from the panel 10 by, for example, the force of the tool 140 being held.

Figure 20:
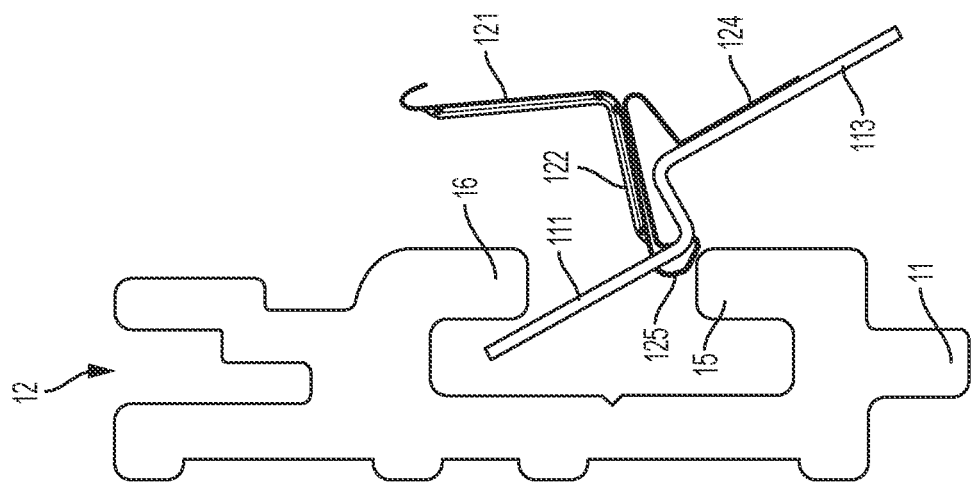
FIG. 20 is another side view of the securing member and a wall panel according to the exemplary embodiment.
Figure 19:
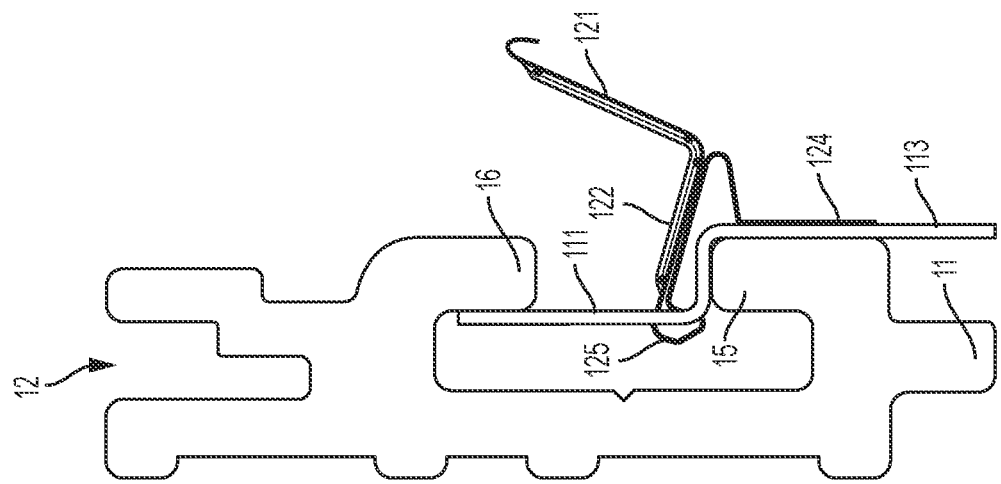
FIG. 19 is another side view of the securing member and a wall panel according to the exemplary embodiment.

FIGS. 19 and 20 illustrate the securing member 100 being removed from the panel 10. As shown in FIG. 19, a user pulls on the gripping member 121. That moves the latching portion 125 up above a top of the lower panel hook 15. This unlocks the securing member 100 from the panel 10. As shown in FIG. 20, the upper section 111 is pivoted inward, towards the rear 19 of the panel 10, and the securing member 100 can be slid out in a downward and frontward direction.

Figure 21:
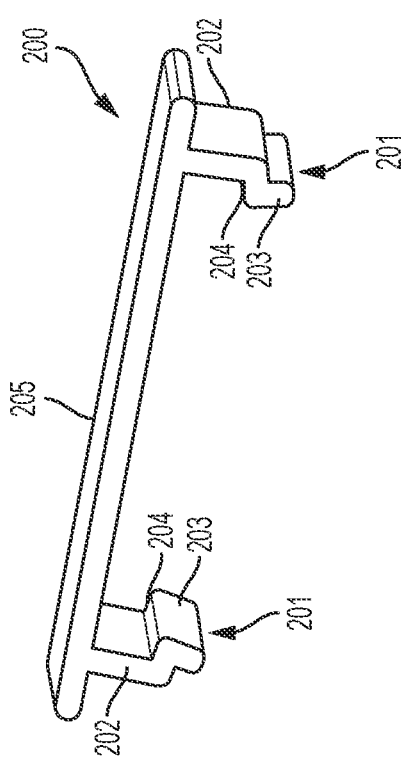
FIG. 21 is a perspective view of a clip according to an exemplary embodiment.
Figure 22:
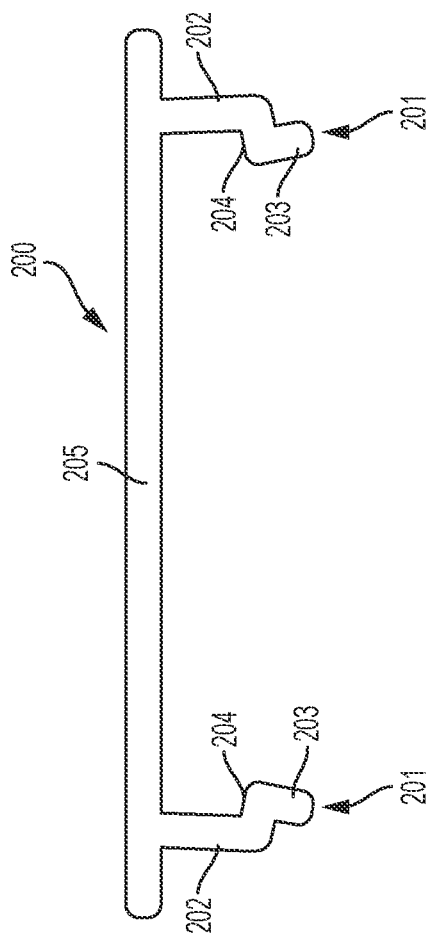
FIG. 22 is a side view of the clip according to the exemplary embodiment.

FIGS. 21 and 22 illustrate a clip 200 for use with the panels. FIG. 21 is a perspective view of the clip 200 and FIG. 22 is a side view of the clip 200. The clip 200 includes two leg members 201. The leg members 201 are made up of a base portion 202 and a finger portion 203. There is an abutting surface 204 at one end of the finger portion 203, which secures the clip on a panel, as discussed in further detail below.

The leg members 201 are configured to fit over a lower panel hook 15 and an upper panel hook 16. In particular, the leg member 201 at the upper end of the clip 200 fits over a lower panel hook 15 and the leg member 201 at the lower end of the clip 200 fits over an upper panel hook 16. This requires either that multiple of the panels 10, 20, 30 be configured together or that there be a different panel design. For example, a fourth panel 50, shown in FIG. 23.

Figure 23:
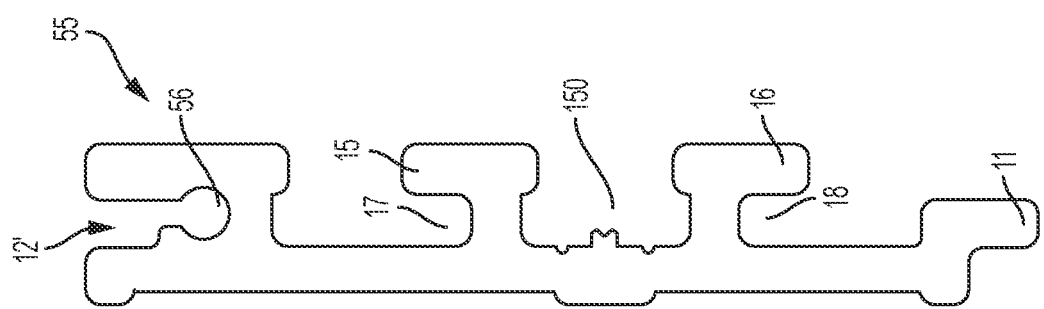
FIG. 23 is a side view of a fourth panel according to an exemplary embodiment.

As shown in FIG. 23, the fourth panel 50 includes a lower panel hook 15 and an upper panel hook 16 as well as the accompanying spaces 17 and 18. As shown, the panel hooks 15 and 16 are in different locations in the fourth panel 50. The fourth panel 50 also includes a connector portion 11 which can be connected with another fourth panel 50 or other panels 10, 20, 30. The fourth panel 50 includes a modified connector receiving portion 12'. The modified connector receiving portion 12' is still configured to receive connector portions 11 and peg board 60. However, the peg board 60 is received forward of the location in the previously discussed connector receiving portion 12. Additionally, the modified connector receiving portion 12' includes a circular groove 56 which may receive a wire or the like. The fourth panel 55 also includes a central groove 150

FIGS. 24-27 show the clip 200 in use. One leg 201 of the clip 200 fits over a lower panel hook 15 and the other leg 201 of the clip 200 fits over the upper panel hook 16. Legs 201 have some flexibility. The flexibility allows the legs 201 to snap over the panel hooks 15 and 16 and the abutting surface 204 to snap behind the panel hooks 15, 16. This secures the clip 200 in place on the fourth panel 55. In order to remove the clip 200, again the legs flex so that the abutting surfaces 204 travel over the panel hooks 15, 16 and the clip 200 is removed from the panel 55. The base 205 of the clip 200 may also have some flexibility to aid in the securing and removal of the clip 200 to the panel 55.

Figure 24:
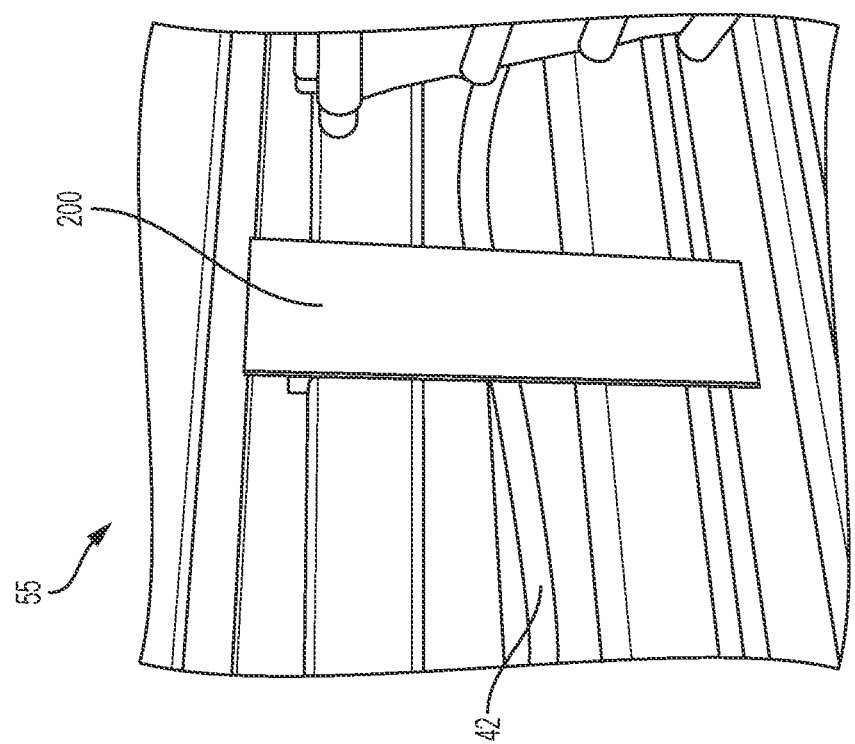
FIG. 24 is a perspective view of the clip and fourth panel according to the exemplary embodiment.

As shown in FIG. 24, when the clip 200 is secured to the panel 55, the clip 200 covers the central groove 150 at the location of the clip 200. In particular, the clip base 205 covers the central groove 150. This may be used to secure items in the central groove 150, such as the power cord 42 shown in FIG. 24.

Figure 25:
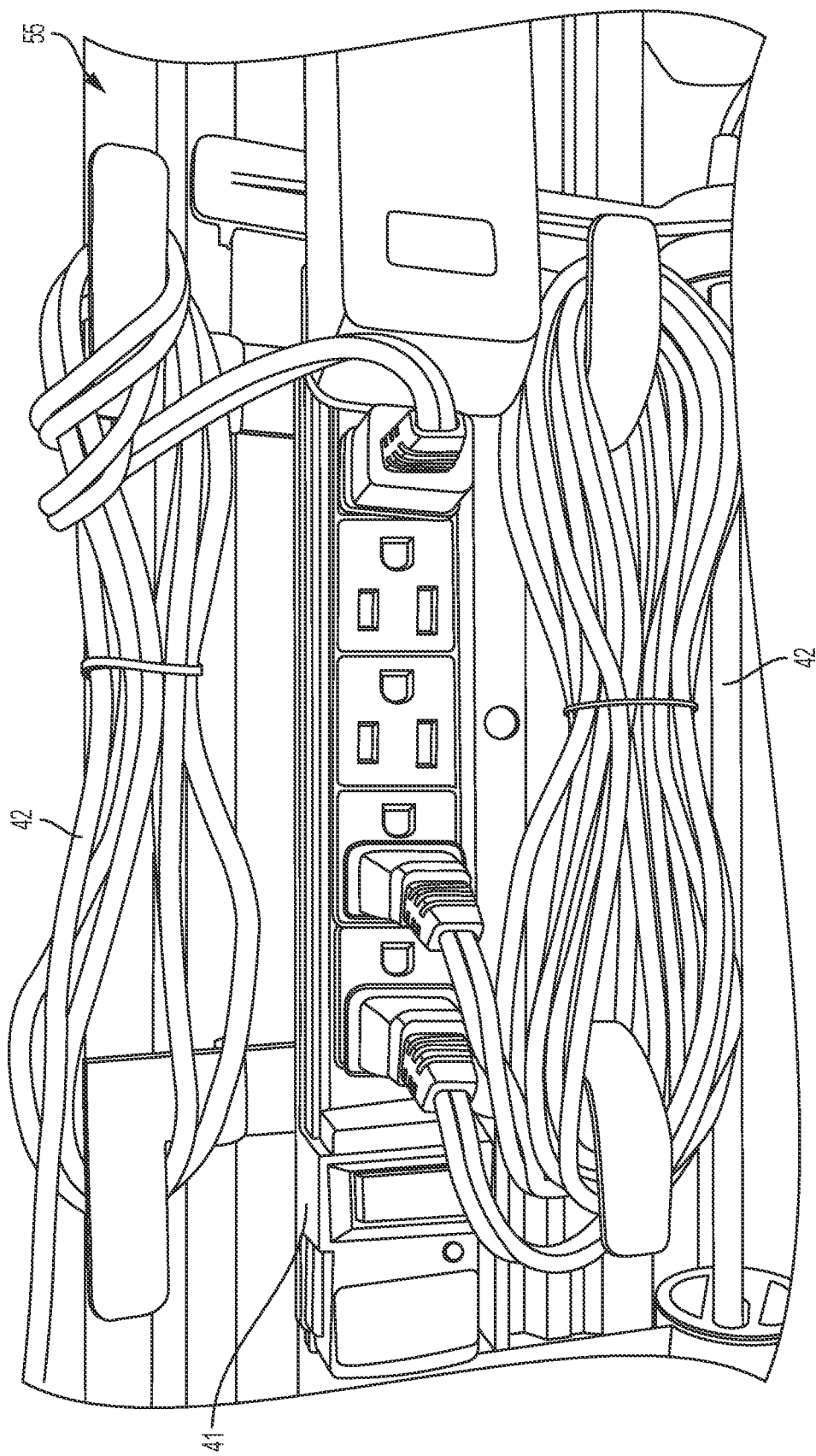
FIG. 25 is a front view of a power strip and wall panel assembly according to an exemplary embodiment.
Figure 26:
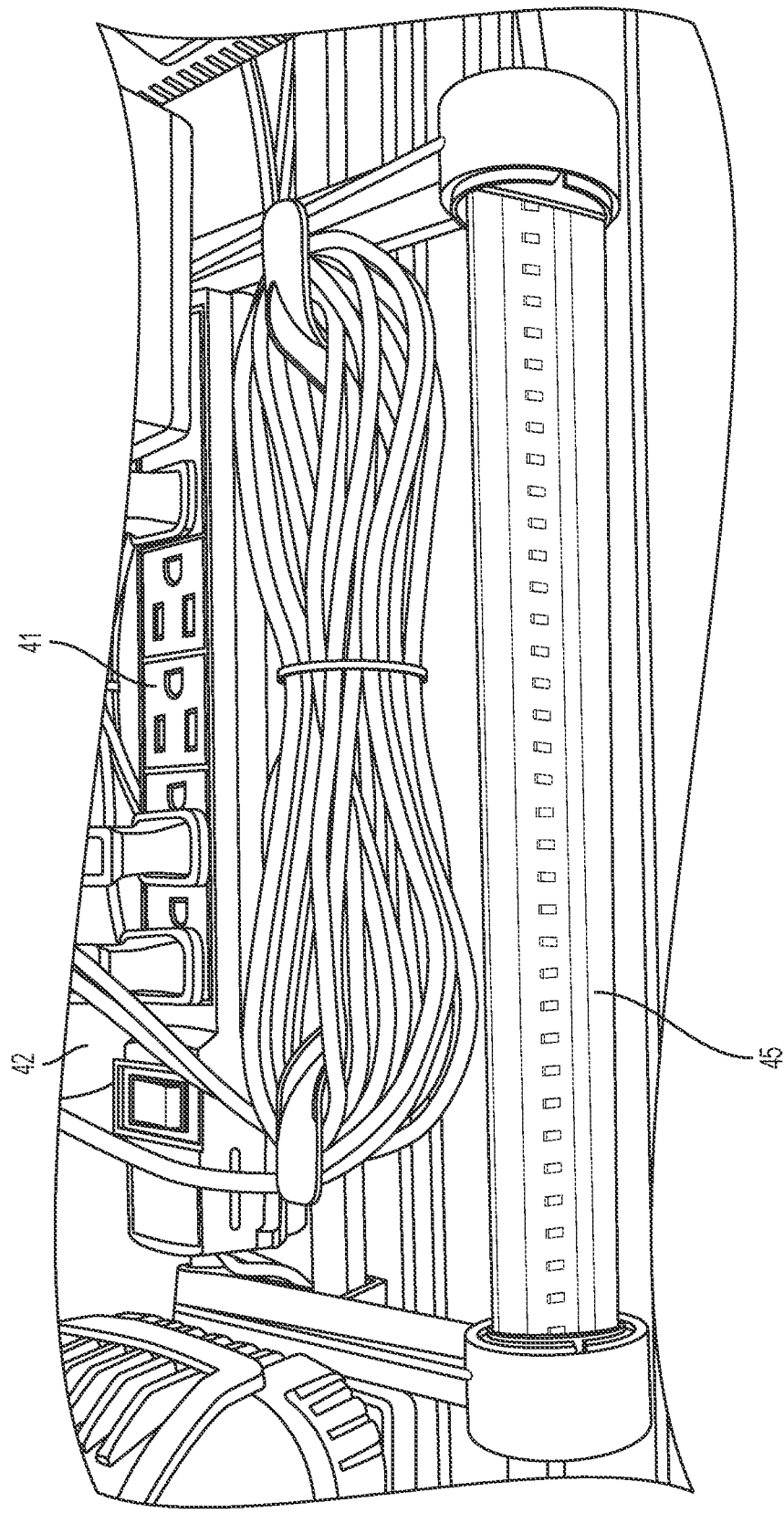
FIG. 26 is a front view of a power strip and wall panel assembly according to an exemplary embodiment.
Figure 27:
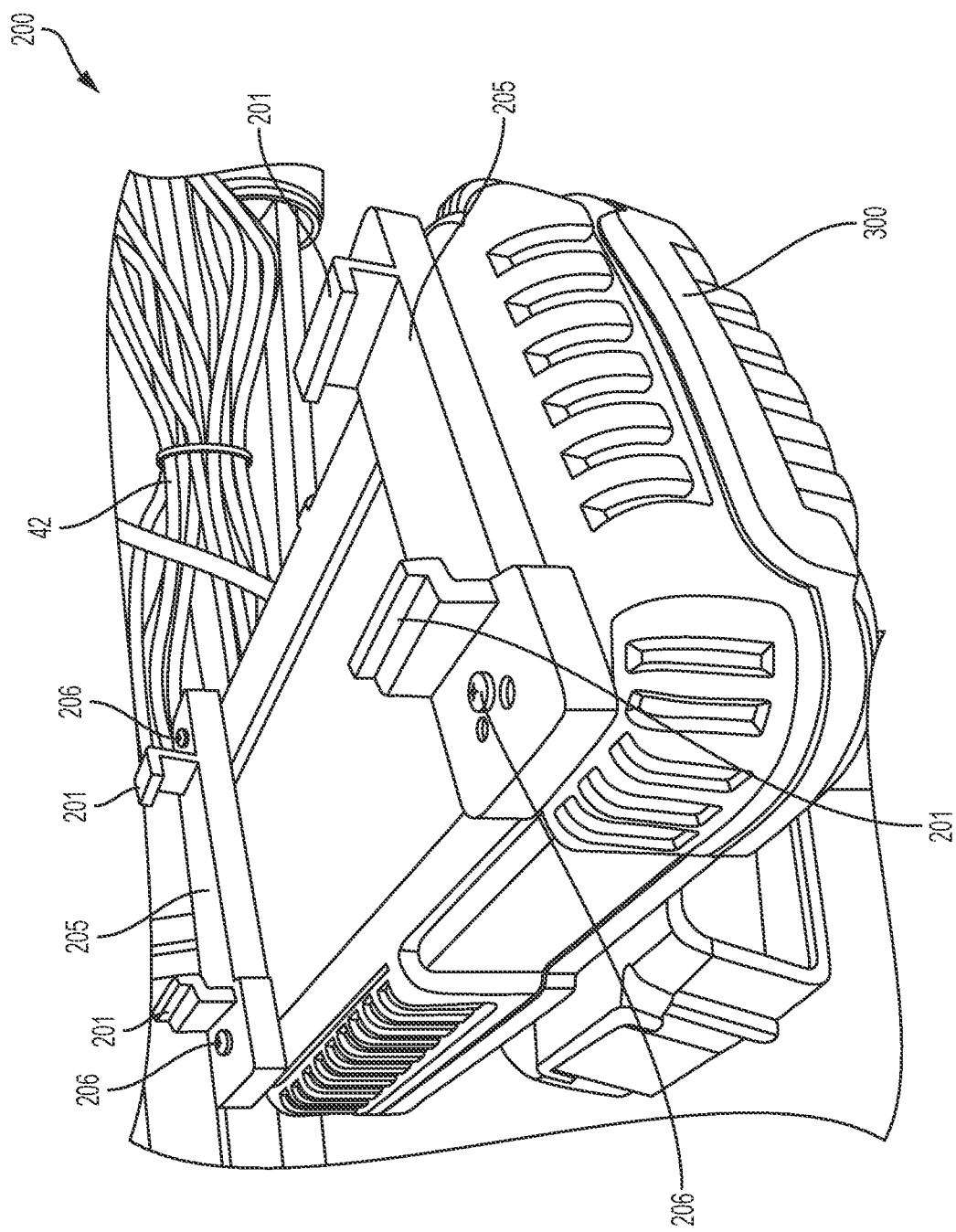
FIG. 27 is a perspective view of a the clips attached to a battery charger according to an exemplary embodiment.

The clips 200 may be secured to items such as the power strip 41 shown in FIGS. 25 and 26, a battery charger 300, as shown in FIG. 27, or other tools or items so that the items can be secured to the panel 55 (or an appropriate combination of panels 10, 20, 30). As shown in FIG. 27, the clips 200 may be secured to an item such as a battery charger 300. In FIG. 27, the clips are secured to the base of the battery charger 300 by screws 206. Other fasteners or attachment methods may be used or the clips 200 could be integrally formed with the item. In some instances, only the legs 201 may be joined with or integrally formed with the item and the legs 201 will allow the item to snap onto the panel 55 or a combination of panels.

FIGS. 25 and 26 illustrate a second power strip 41. The second power strip 41 has a number of outlets, like the first power strip 40 and also includes posts for wrapping power cords 42. The power strip 41 may be attached to the panel 55 through the use of the clips 200. As discussed above, the clips 200 may be attached to the power strip 41 in any of a number of ways and, in some instances, it may be suitable only to include the legs 21 of the clips 200. The power strip 41 may include a light bar 45, as shown in FIG. 26. The light bar 45 includes a number of light emitting diodes (LEDs) and serves as an illumination device. The light bar 45 may have a separate switch to turn on and off the LEDs or the LEDs may turn on with the power strip 42.

Figure 28:
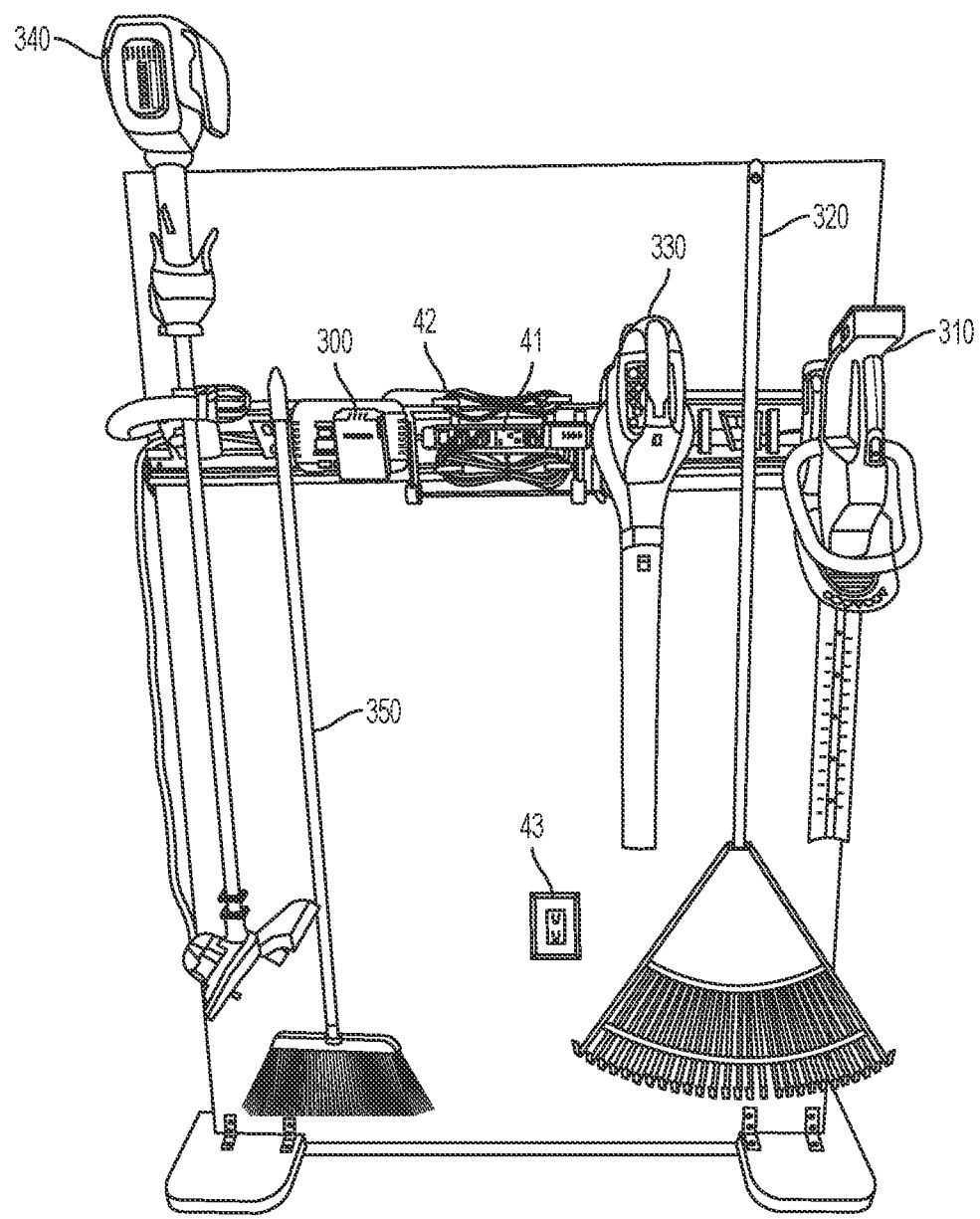
FIG. 28 is a front view of a wall panel assembly according to an exemplary embodiment.

In combination, the panel 55 and clips 200 described above, in combination with other clips and hooks, may be used to make the wall storage hanging arrangement of FIG. 28. As shown in FIG. 28, there is a battery charger 300, hedge trimmer 310, rake 320, blower-vac 330 and string trimmer 340 all hanging on the panel 55 along with the power strip 41. The power strip 41 may be plugged into a wall power outlet 43. Items that require power, such as the battery charger 300, may then be plugged into the power strip 41 to provide power to the battery charger 300. Additionally, as discussed above, power cords 42 may be routed through the central groove 150 and may be secured in the groove by clips 200.

FIGS. 29-51 illustrate another exemplary embodiment. Features of the exemplary embodiment of FIGS. 29-51 may be used with the exemplary embodiments shown in FIGS. 1-28.

Figure 29:
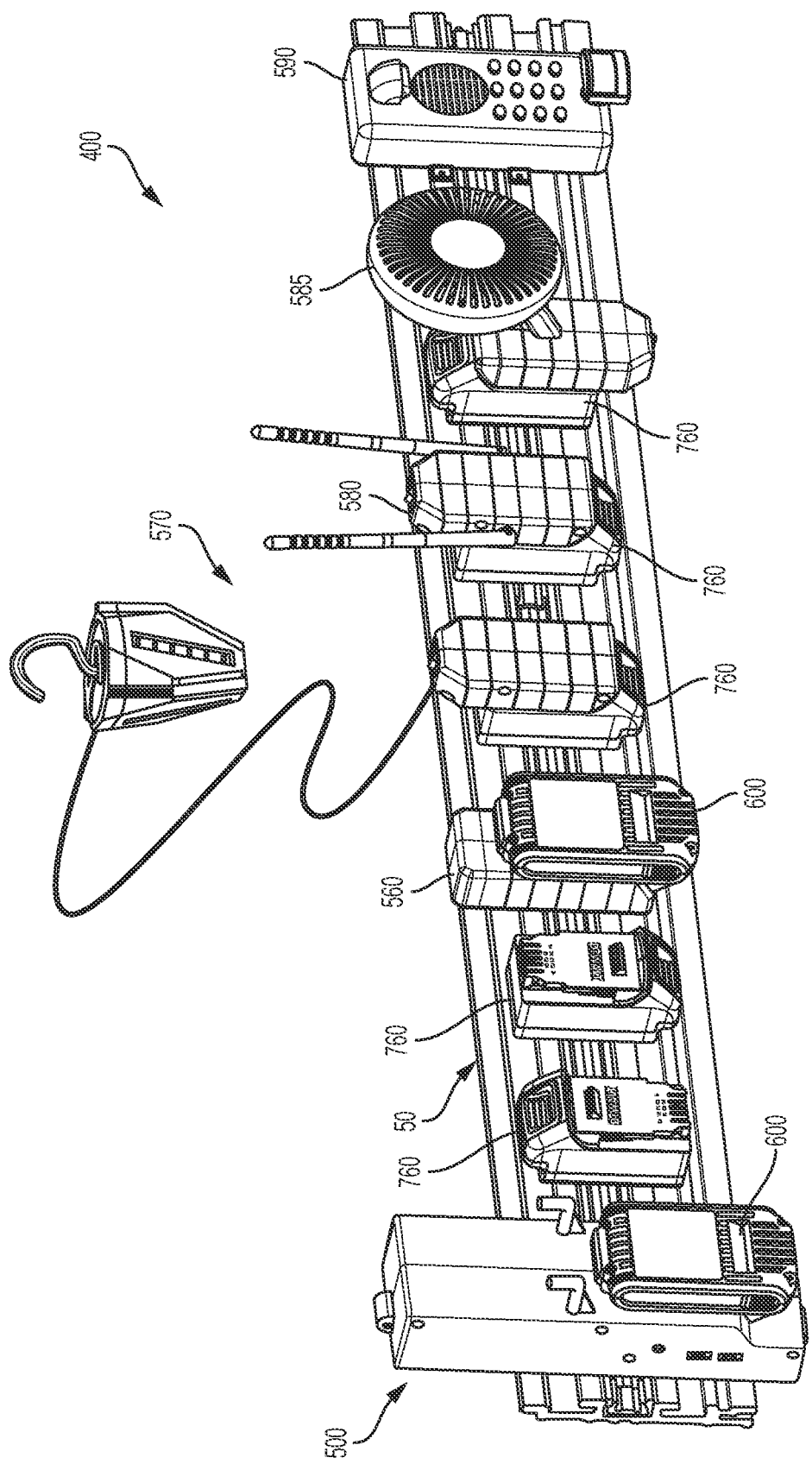
FIG. 29 is a perspective view of a wall panel assembly system according to another exemplary embodiment.

FIGS. 29 and 30 are perspective view of a powered wall panel system 400. The powered wall panel system 400 includes the fourth wall panel 50 and an insert 450. The insert 450 includes three conductors 451, 452 and 453, which conduct power along the wall panel 50. As shown in FIG. 29, the panel 50 supports a power supply and control box 500. The power supply and control box 500 provides power to the insert 450. The insert 450 conducts power along the wall panel 50 to any of the variety attachments 550 shown thereon. The attachments include a battery charger 560, a light 570, a Wi-Fi router 580, a fan 585 and a security system 590. The attachments 550 may be able to directly connect to the wall panel 50 and the insert 450. For example, the battery charger 560 and the security system 590 each attach directly to the wall panel 50. Other attachments may be powered through an attachment interface 600.

Figure 53:
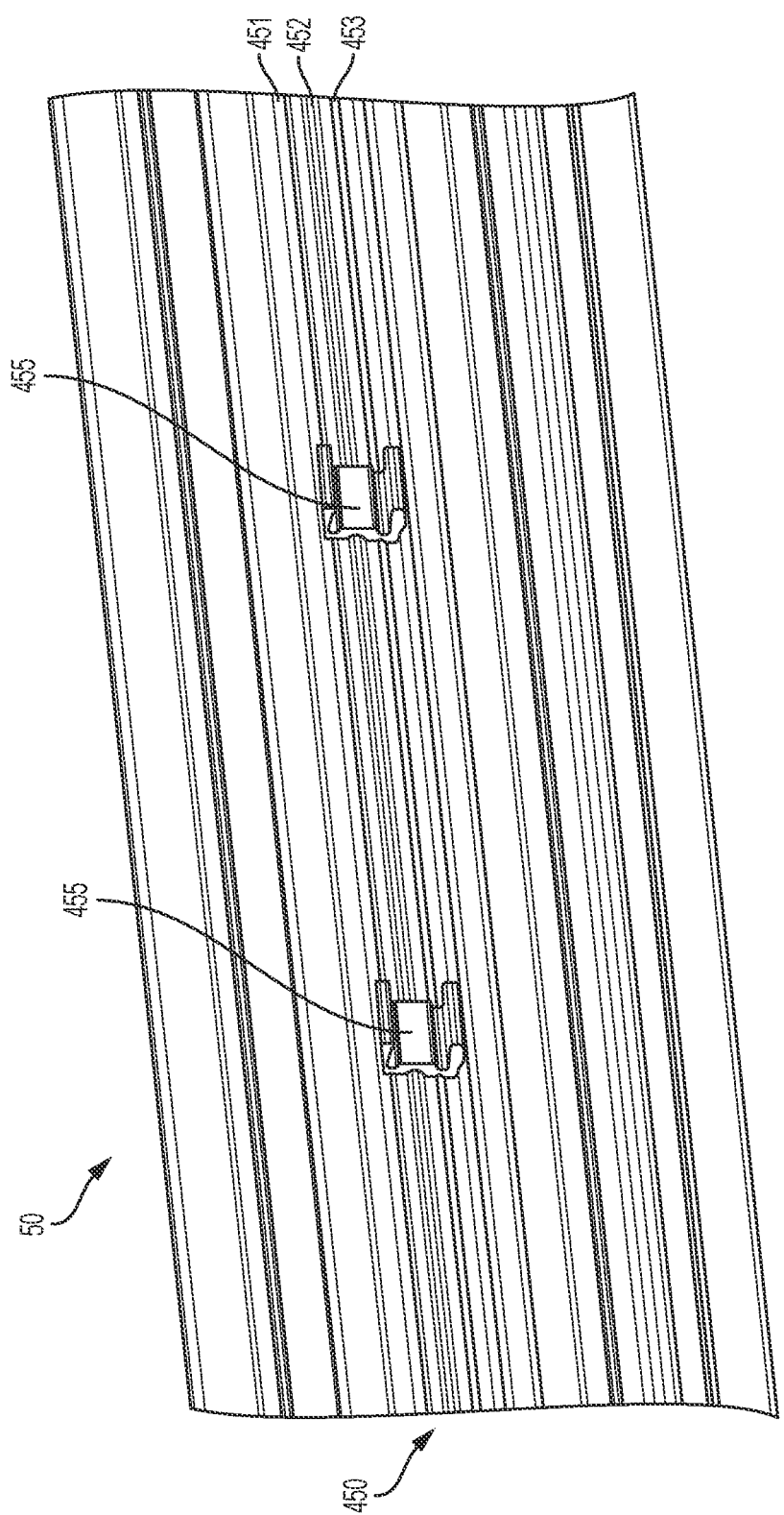
FIG. 53 is a perspective view of a portion of the wall panel and insert according to an exemplary embodiment.
Figure 54:
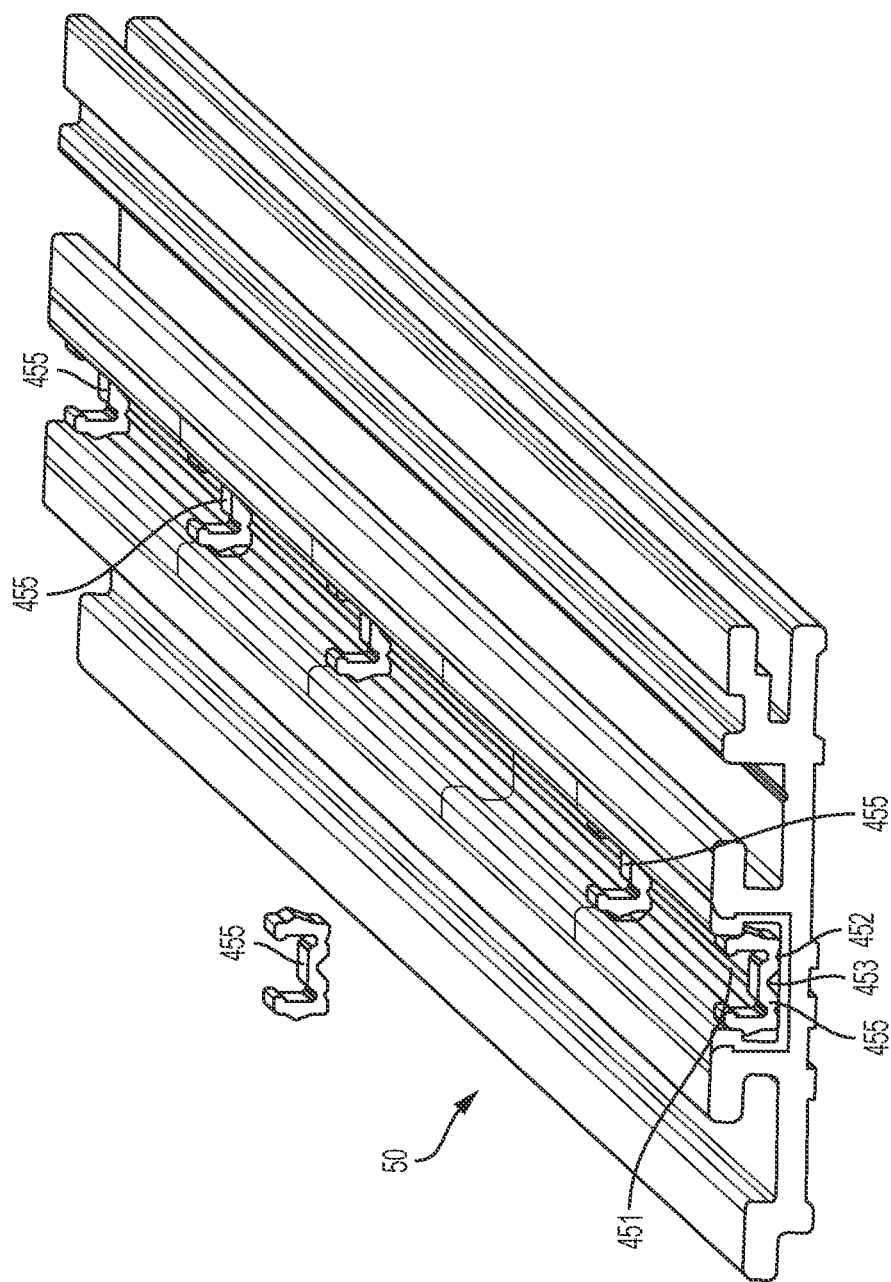
FIG. 54 is another perspective view of a portion of the wall panel and insert according to an exemplary embodiment.
Figure 55:
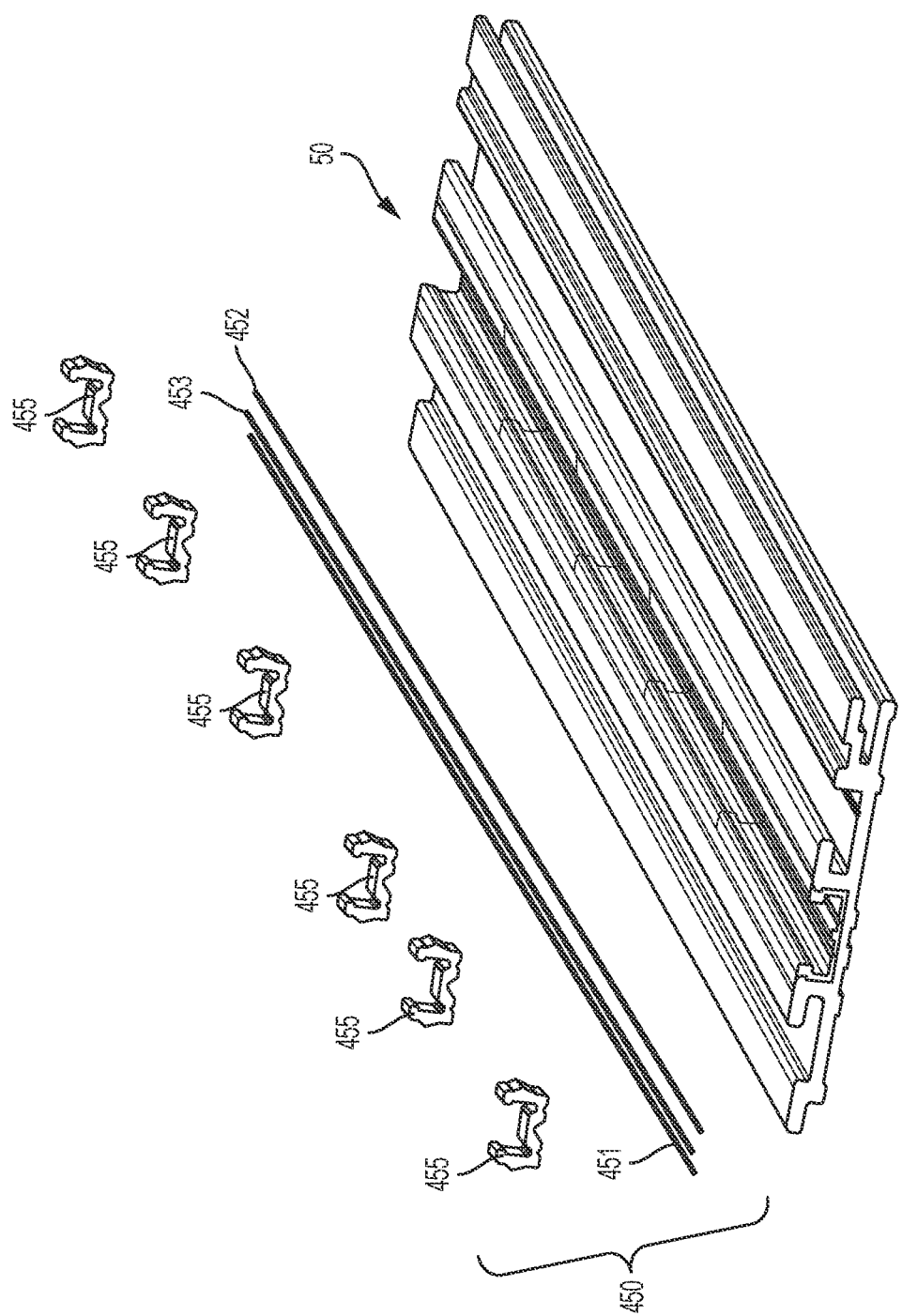
FIG. 55 is another perspective view of a portion of the wall panel and insert according to an exemplary embodiment.

FIGS. 30, 31 and 53-55 illustrate the mechanical features of the insert 450 with the panel 50. FIG. 30 is a perspective view of the wall panel 50 with the insert 450 attached to the panel 50. FIG. 31 is a perspective view of one end of the panel 50 with the insert 450. FIG. 53 is a close-up view of a central section of the panel 50 with the insert 450. FIG. 54 is an end perspective view of the panel 50 with the insert 450 with one of the clips 455 shown unassembled from the panel 50. FIG. 55 illustrates an end perspective view of the panel 50 with the insert 450 not assembled with the panel 50.

As noted above, the insert 450 includes three conductors 451, 452, 453. The three conductors 451, 452, 453 run parallel to one another along a horizontal axis of the wall panel 50, the wall panel 50 being configured to hang horizontally on a wall. The conductors 451, 452, 453 are vertically spaced apart from one another and do not contact one another. A series of clips 455 hold the conductors 451, 452, 453 in place along the wall panel 50. Additionally, the clips 455 are designed to fit into the groove 150 of the wall panel 50 and are held in place there. In this way, the insert 450 can be inserted into an existing panel. As shown, the conductors 451, 452, 453 are held fixed between the clips and a surface of the panel 50. In the exemplary embodiment, the conductors 451, 452, 453 are not secured to the clips 455 independently. That is, the conductors 451, 452, 453 are separate from the clips 455 before insertion and are held by being sandwiched between the clips 455 and the panel. The clips 455 are shaped to snap into and be secured by the wall panel 50. In other embodiments the conductors and clips could be formed as one part, or the conductors could clip into the clips 455 or wall panel 50. Additionally, in other embodiments, conductors may be formed along with the wall panel, such that the conductors are not part of an insertable and removable insert.

Figure 32:
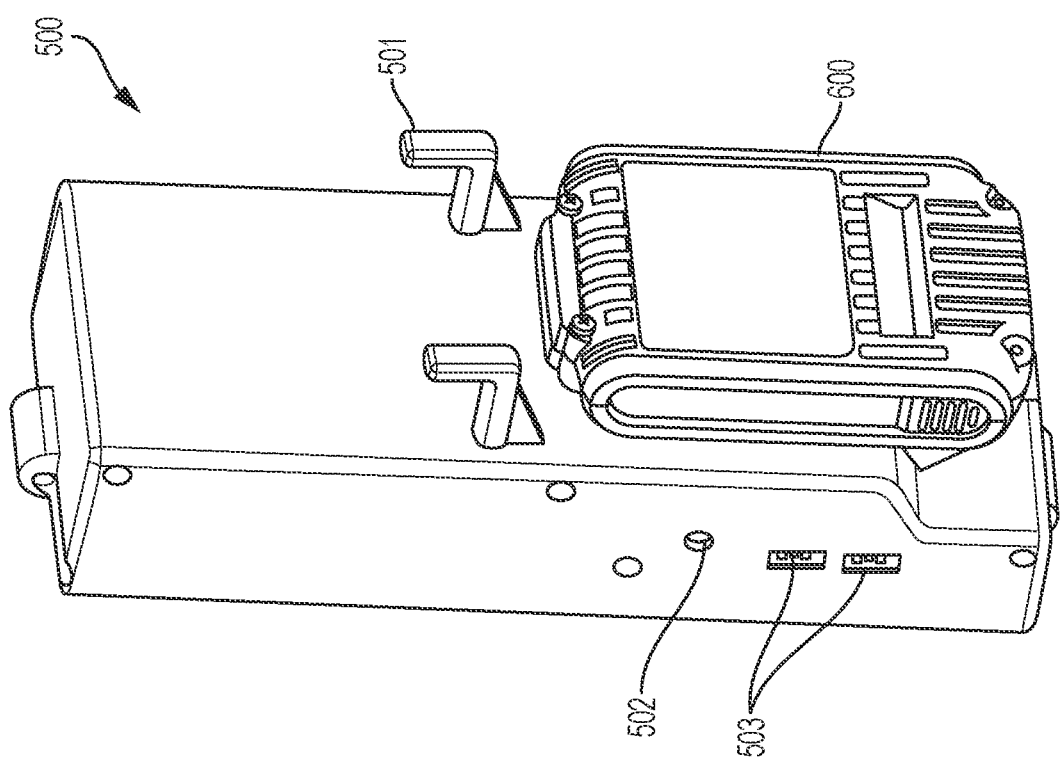
FIG. 32 is a perspective view of a control box according to the exemplary embodiment.

The control box 500 is shown in further detail in FIGS. 32-35. As shown in FIG. 32, the control box 500 receives a battery pack 600. The control box 500 includes a battery pack receiving portion 505. The battery pack receiving portion 505 includes rails for guiding the battery pack 600 into place as well as electrical connectors for connecting with the battery pack 600. The battery pack 600 connected to the control box 500 serves as a ballast battery. The battery pack 600 may be a power tool battery pack that can be used to power a variety of power tools, such as drills, saws, sanders and the like. The battery pack receiving portion 505 may be the same as the receiving portion for power tools which the battery pack 600 may receive. The battery pack 600 may be one of the battery packs shown in U.S. Pat. No. 9,406,915.

The control box 500 includes a pair of hooks 501 on a front side. The hooks 501 may be used to hold a screwdriver, phone or other item. The control box 500 also includes an input jack 502 which receives a cord with a power input, such as an AC input or a DC input provided by solar panels, as will be discussed later. Also shown in FIG. 53, the control box 500 may include USB ports 503. The USB ports 503 can be used to charge or power phones or other devices from the power input through the jack 502 or the battery pack 600.

As shown in FIGS. 34 and 35, the control box 500 includes a pair of legs 201 on its rear side. The legs 201 are the same as the legs 201 described for the clip above. In this case, the legs 201 are integrated into the control box 500. In other embodiments, a separate clip 200 could be attached to the rear of the control box 500. The legs 201 include base portions 202, finger portions 203 and an abutting surface 204 and allow the control box 500 to latch onto the panel wall 50 in the manner shown in FIG. 34 and discussed above with respect to the legs 201.

Figure 33:
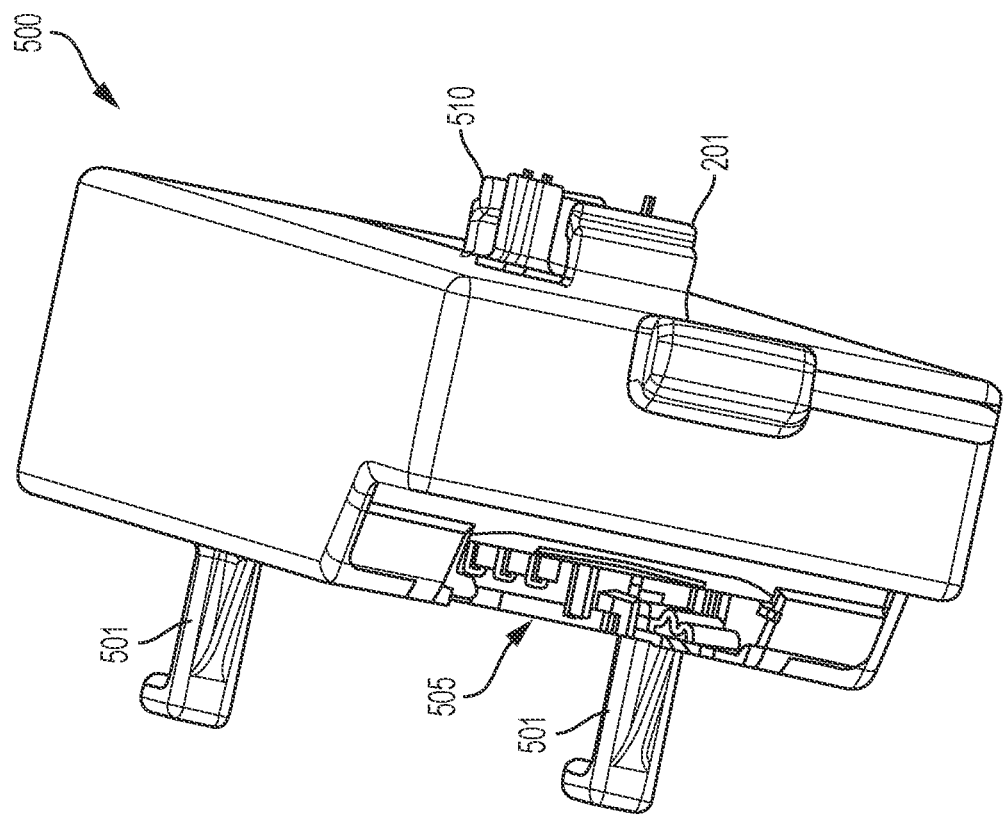
FIG. 33 is another perspective view of a control box according to the exemplary embodiment.

As shown in FIGS. 33-35, the control box 500 has a power supply connector 510 which connects it to the conductors 451, 452 and 453. The power supply connector 510 is shown by itself in FIG. 36. As shown in FIGS. 34 and 35, part of the power supply connector 510 projects out of the rear of the control box 500. That portion includes three pins 511, 512 and 513. Pin 512 is a ground pin and pins 511 and 513 are positive pins. The three pins 511, 512, 513 contact the three conductors 451, 452, 453.

Figure 36:
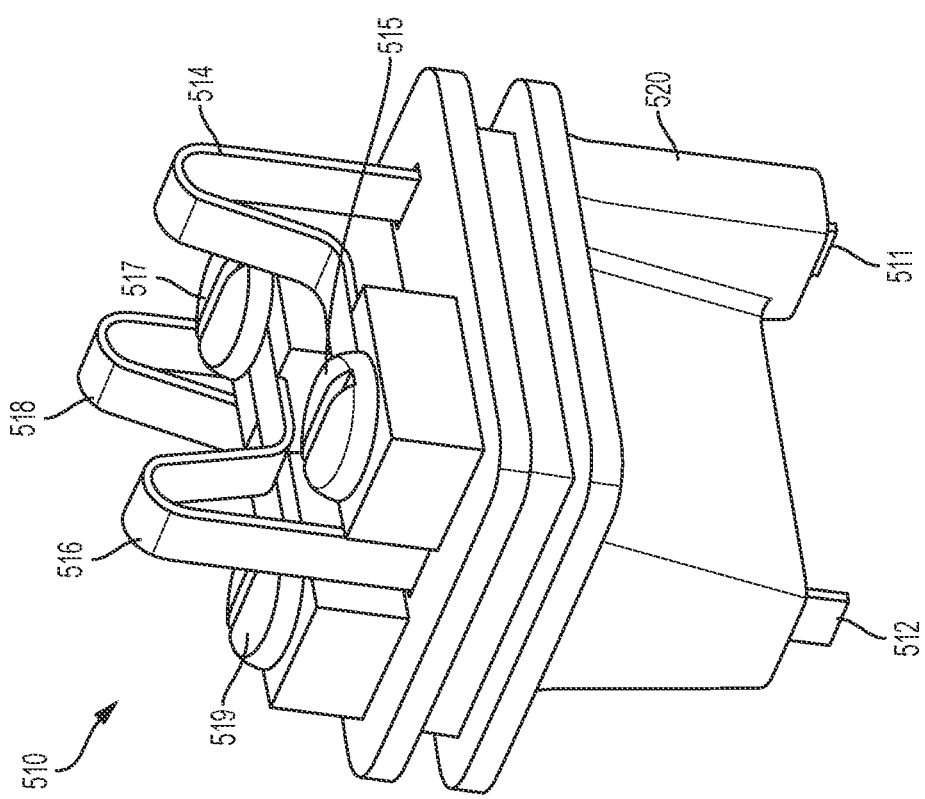
FIG. 36 is a perspective view of a power supply connector according to the exemplary embodiment.
Figure 38:
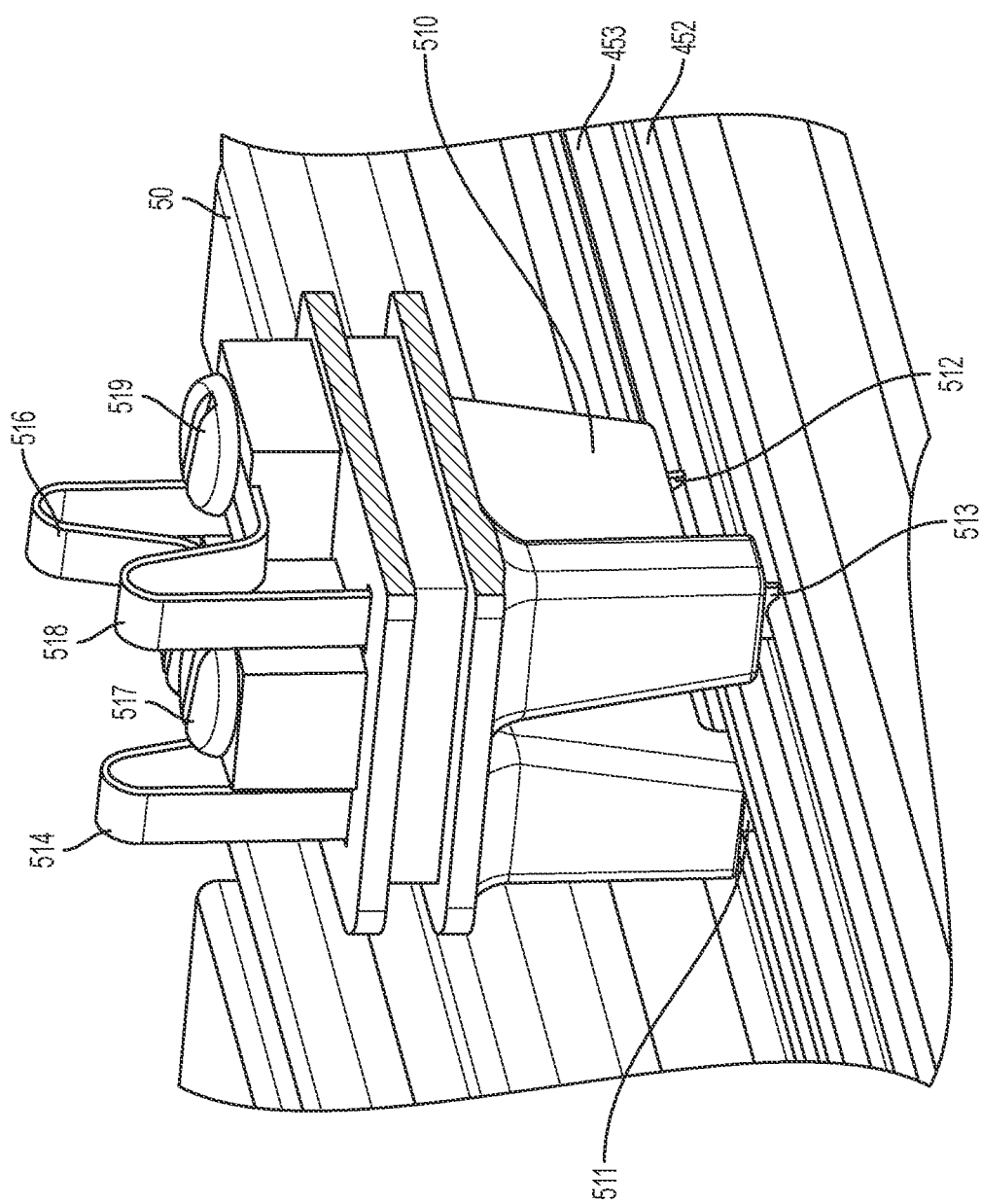
FIG. 38 is a perspective view of a power supply connector engaged with an insert on a wall panel according to the exemplary embodiment.

As shown in FIG. 36, the pins 511, 512, 513 are part of larger connectors 514, 516, 518. Specifically, pin 511 is an end of connector 514 which is attached with a screw 515 to the rest of the power supply connector 510. Pin 512 is part of connector 516 attached by a screw 517. Pin 513 (not shown in FIG. 36) is part of pin 518 attached by screw 519. The connectors 514, 516, 518 are made of metal and have elasticity such that they act as a spring. In particular, the pins 511, 512, 513 are biased downwardly towards the conductors 451, 451, 453 when the power supply connector 510 is on the wall panel 50 with the insert 450. The pins 511, 512, 513 may retract upwards into the housing 520 of the power supply connector 510 in response to being pressed on the conductors 451, 452, 453. That is, the pins 511, 512, 513 are able to move some and may be pressed upwardly when the power supply connector 510 is in contact with the conductors 451, 452, 453, as is shown in FIGS. 34 and 38. In this way, the pins 511, 512, 513 are biased against the conductors 451, 452, 453 to provide good contact between the pins 511, 512, 513 and conductors 451, 452, 453. The shape of the connectors 514, 516, 518 allows the pins to move in a generally linear fashion when they retract.

Figure 52:
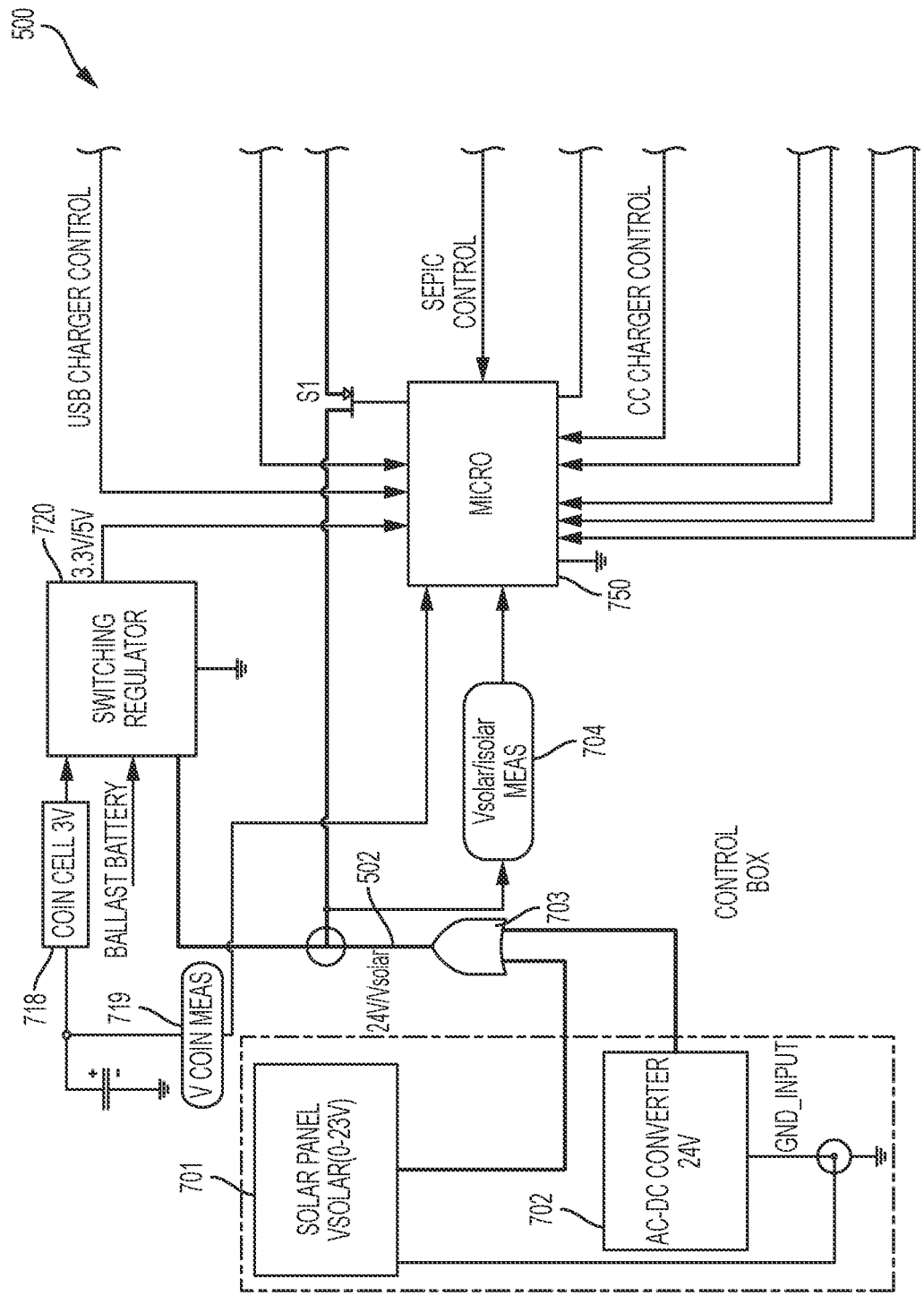
FIG. 52 is a schematic of the control box according to an exemplary embodiment.
Figure 52:
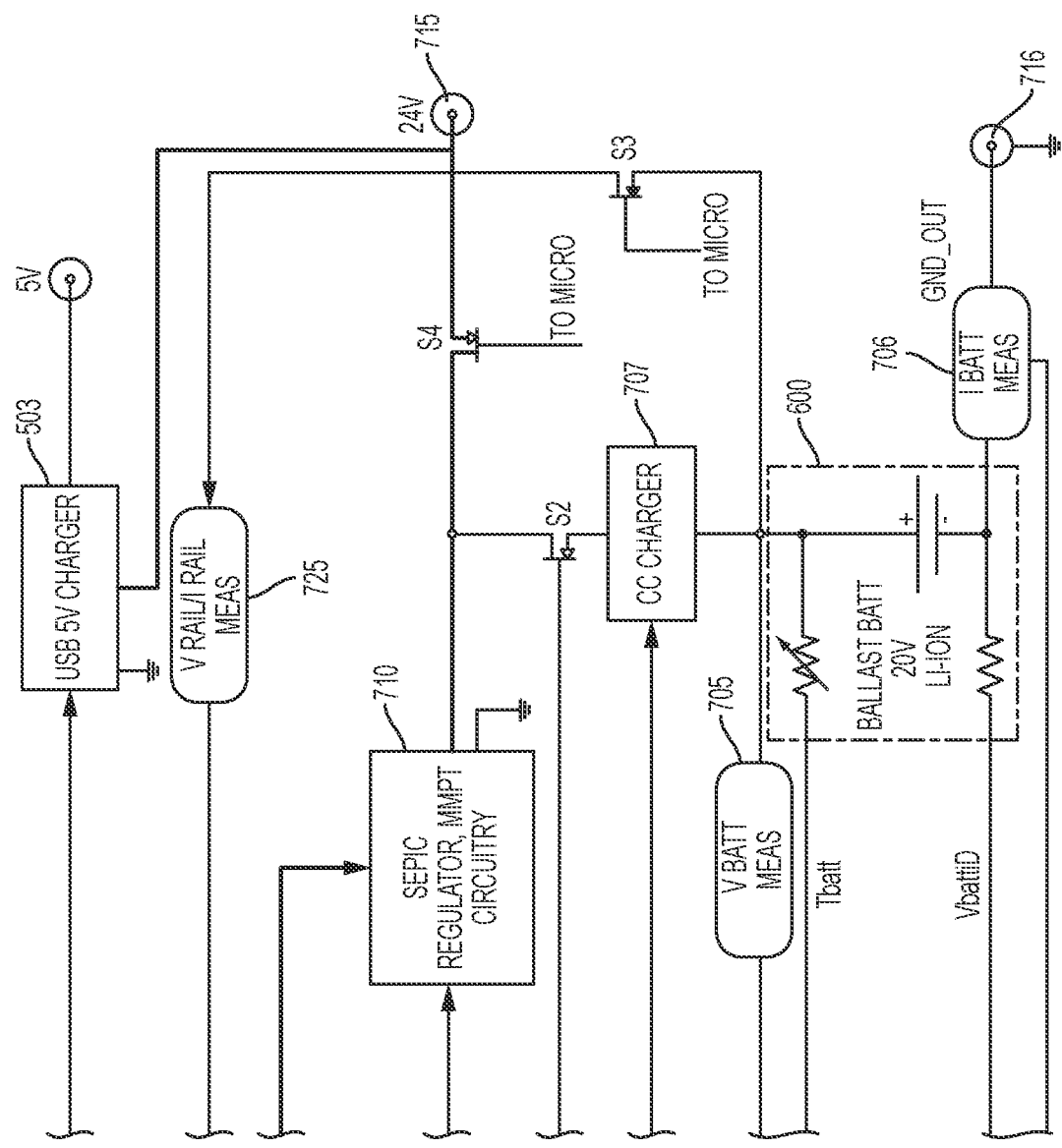

A schematic diagram of the control box 500 is shown in FIG. 52. As shown in FIG. 32, the control box 500 includes an input jack 502 for receiving power. In the schematic of FIG. 52, the power comes from either solar panels 701 or AC power from an electric wall outlet which is converted to DC power with an AC/DC converter 702. When a user has a wall outlet available, the user may simply run a plug from the wall outlet to the input jack 502. The AC/DC converter 702 is housed in a block, as is well known, and converts the AC power from the electric wall outlet to 24V DC power which is provided to the control box 500 at input jack 502.

In other instances, solar power from solar panels 701 may be available. The user may choose to use the solar power instead of power from an electrical wall outlet or an electrical wall outlet may not be available. In this instance, a cord provides power from the solar panels 701 to the control box 500 through the input jack 502. The solar panels 701 are a DC power source. Accordingly, there is no need for an AC/DC converter 702, as there is when using power from an AC power source. In the exemplary embodiment, there is only one input jack 502 and only one power source is input to the control box 500 at one time. This is represented by the OR block 703 in the schematic of FIG. 52.

Depending upon the number of solar panels and the weather, the solar panels 701 may provide power at different voltage and current levels. As discussed later, the system may operate differently under different power conditions. Accordingly, there is a solar voltage and current measuring circuit 704 which reads the voltage and current from the solar panel and provides that information to the microcontroller 750.

The ballast battery 600 is also shown in FIG. 52. The ballast battery 600 operates at a maximum initial battery voltage of 20 volts. As shown in FIG. 52, the control box 500 includes a battery voltage measuring circuit 705 for measuring the voltage of the ballast battery 600 and a battery current measuring circuit 706 for measuring the current of the ballast battery 600. The ballast battery 600 can output power to the system. Additionally, there is charge control circuitry 707 which allows the ballast battery 600 to charge.

The ballast battery 600 provides a ballast for the system. When the solar panels 701 are producing more power than is needed by the system, excess power can be stored in the ballast battery 600. That is, the ballast battery 600 can be charged. In instances where the solar panels 701 provide insufficient power for the system, the ballast battery 600 can assist. When no power is provided through the input jack 502 by either an AC power source, solar power source or otherwise, the ballast battery 600 can itself provide DC power to the conductors 451, 452, 453 of the wall panel 50 with insert 450. Typically, the AC power source provides sufficient power for the system that the ballast battery 600 is not needed to provide supplemental power. Additionally, the AC power source typically provides sufficient power to charge the ballast battery 600. Accordingly, when the AC power source is inputted through the input jack 502, typically the battery 600 charges. However, it is possible to utilize the AC power source in other ways. For example, the system may be designed to use the ballast battery 600 as a supplemental power source if the AC power source is insufficient. Additionally, AC power source may be used only for powering the insert 450, and not charging the battery 600, if there is sufficient load on the insert 450.

The control box 500 also includes a SEPIC regulator 710. As discussed, the power provided by the solar panels 701 is variable. On the other hand, the power provided to the conductors 451, 452, 453 needed to run the accessories 550 must be at least a certain voltage. For example, the accessories 550 such as the fan 585 and the light 570 may need 18V or higher to operate, or operate effectively. Accordingly, if the solar panels 701 are producing power with a voltage of only 10V, that is insufficient for running the accessories 550 on the wall panel 50 with insert 450.

The SEPIC regulator 710 can adjust the power input from the solar panels 701 to adjust the voltage to a suitable level. For example, the SEPIC regulator 710 can adjust the power so that a voltage of 18V, 20V, 22V or 24V is provided, depending upon the particular need. Since power is the product of voltage and current, increasing the voltage decreases the amount of current that can be provided to the conductors 451, 452, 453 by the solar panels 701. Conversely, decreasing the voltage, increases the amount of current that can be provided to the conductors 451, 452, 453.

The schematic of FIG. 52 shows the output of power to the conductors 451, 452, 453 through the connectors 514, 516, 518 and pins 511, 512, 513. In the exemplary embodiment, this connection is provided by wires which attach to the connectors 514, 516, 518 at the screws 515, 517, 519 and are held in place by the screws 515, 517, 519. In particular, line 716 provides a ground feed and connects with connector 516 to provide a ground input at pin 512, which makes conductor 450 a ground conductor. Line 715 outputs a positive voltage signal to pins 511 and 513 through connectors 514, 518, which make conductors 451 and 452 positive rails.

The control box 500 also includes a 3V coin cell 718 and a measurement circuit 719 for measuring a voltage of the coin cell 718. The coin cell 718 may be used to power the microcontroller 750. Switching regulator 720 has inputs from the ballast battery 600, coin cell 718 and either the solar panels 701 or the converted AC power source 702 and can provide power to the microprocessor 750 from any of the sources, as appropriate. The coin cell 718 can provide power when power from the ballast battery 600 or other power sources 701, 702 are unavailable so that the microprocessor 750 can operate.

USB port 503 is also shown schematically in FIG. 52. The USB port 503 outputs at 5V to charge phones, tablets or the like when they are plugged into the port 503.

Finally, the control box 500 includes a rail voltage and current measurement circuit 725 which measures the voltage and current on the conductors 451, 452, 453.

Figure 37:
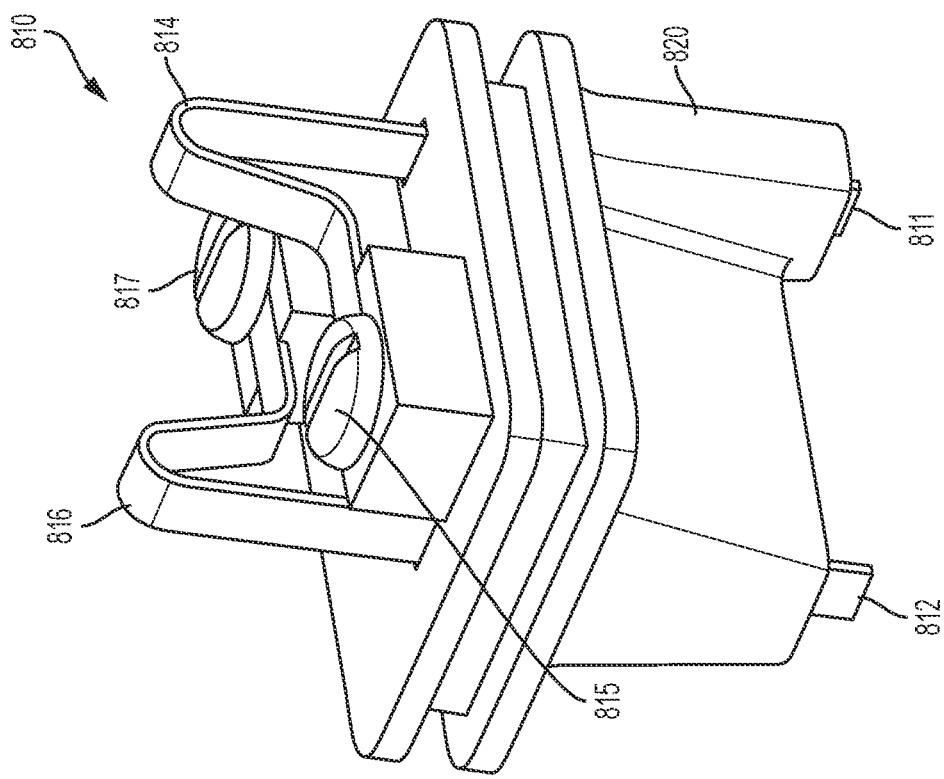
FIG. 37 is a perspective view of a power receiving connector according to the exemplary embodiment.

The accessories which receive power through the conductors 451, 452, 453 use a power receiving connector 810, shown in FIG. 37. The power receiving connector 810 includes a housing 820. A pair of pins 811 and 812 project out of the housing 820. The pin 812 is a ground pin which is configured to engage the ground conductor 453. The pin 811 is a positive pin which is configured to engage one of the positive conductors 451 and 452. As shown, the power receiving connector 810 includes only two pins. The pin 812 is located so as to always engage the ground conductor 453. On the other hand, the pin 811 is located so that it can engage either of the positive conductors 451 and 452 depending upon the orientation of the connector 810. This allows for different orientations of the connector 810 and, thus, the accessories 850.

The pins 811 and 812 of the connector 810 have the same structure as the pins of the connector 510. Pin 811 is an end of a connector 814 which is secured to the connector housing 820 with a screw 815. Pin 812 is an end of a connector 816 which is secured to the connector housing 820 with screw 817. The connectors 814 and 816 are made of metal and have elasticity such that they act as a spring. The pins 811, 812 are biased downwardly towards the conductors 451, 451, 453 when the connector 810 is on the wall panel 50 with the insert 450. The pins 811, 812 may retract upwards into the housing 820 of the power supply connector 810 in response to being pressed on the conductors 451, 452, 453. That is, the pins 811, 812 are able to move some and may be pressed upwardly when the connector 810 is in contact with the conductors 451, 452, 453. In this way, the pins 811, 812 are biased against the conductors 453 and one of 451 and 452 to provide good contact between the pins 811, 812 and selected conductors 451, 452, 453. The shape of the connectors 814, 816 allows the pins 811, 812 to move in a generally linear fashion when they retract.

Figure 39:
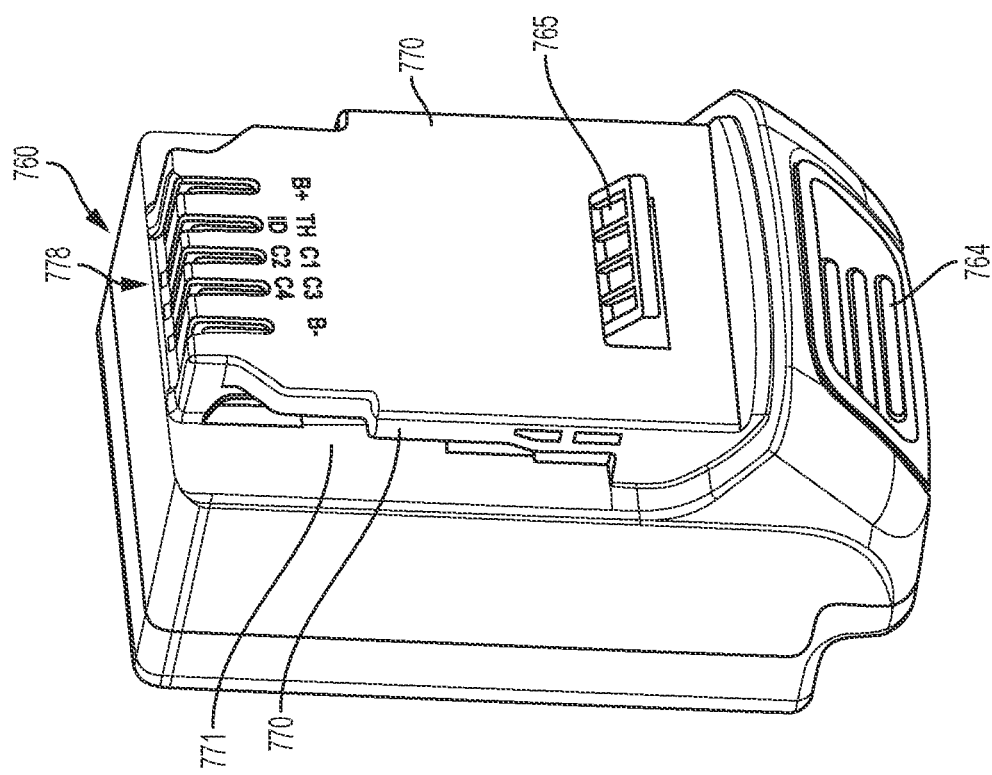
FIG. 39 is a perspective view of an attachment connector according to an exemplary embodiment in a first orientation.
Figure 40:
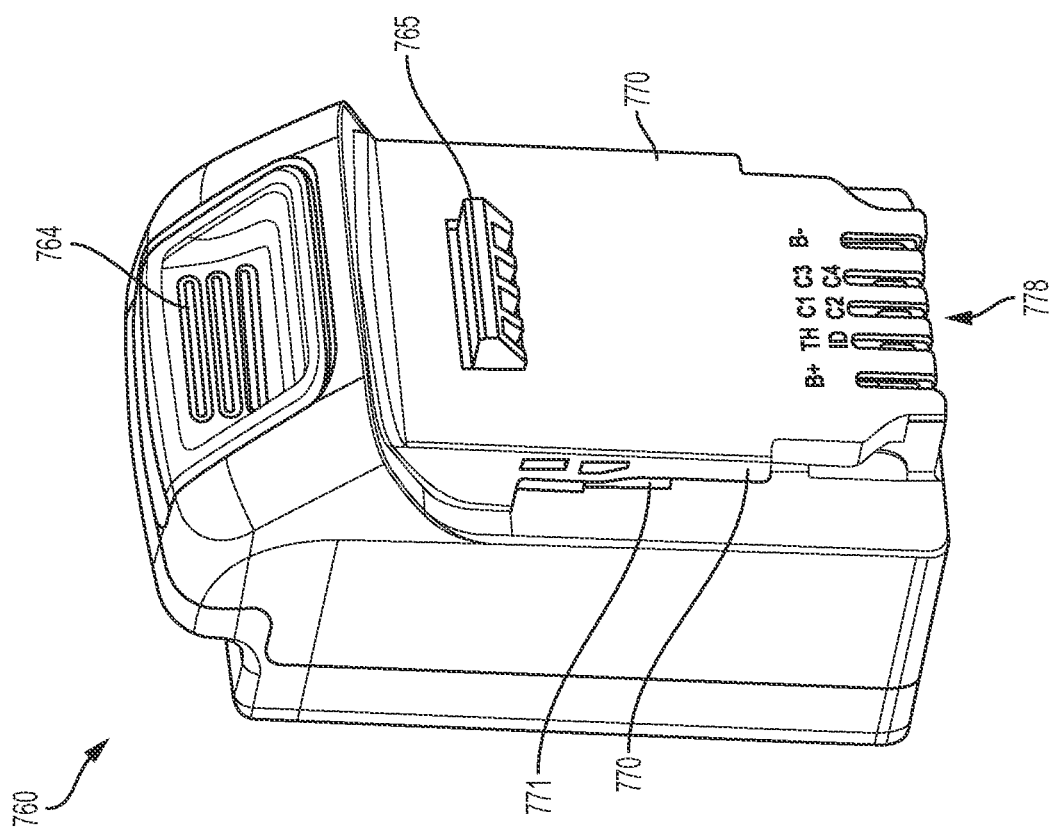
FIG. 40 is a perspective view of the attachment connector according to an exemplary embodiment in a second orientation.
Figure 41:
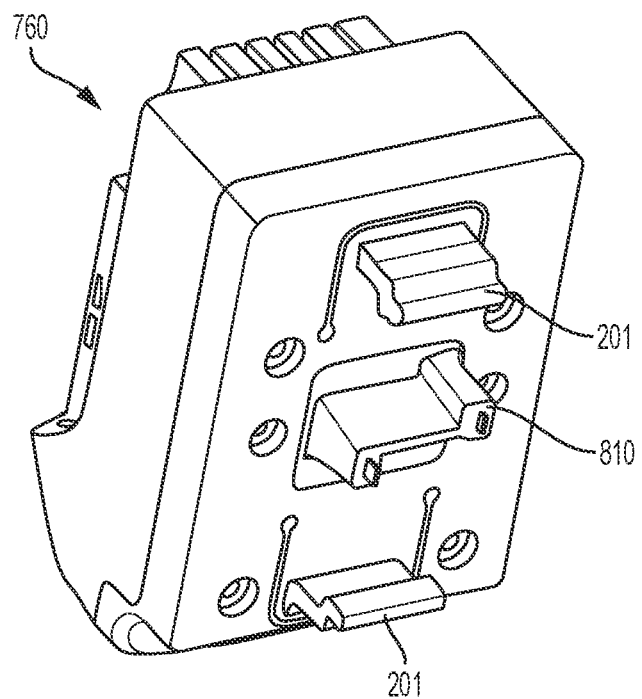
FIG. 41 is a rear perspective view of the attachment connector according to an exemplary embodiment in a first orientation.
Figure 42:
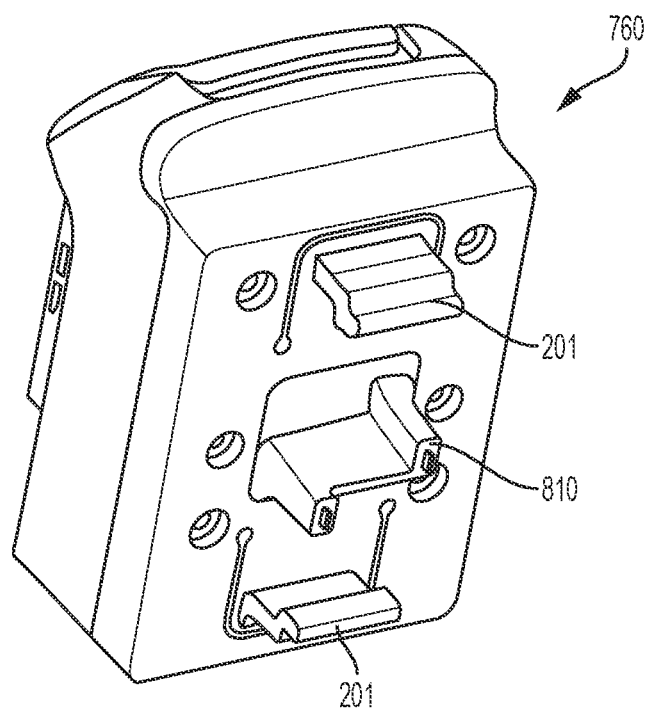
FIG. 42 is a rear perspective view of the attachment connector according to an exemplary embodiment in a second orientation.

FIGS. 39-43 illustrate an attachment connector 760. As shown in FIGS. 41 and 42, the attachment connector 760 includes a pair of clips 201. The clips 201 slidingly attach the connector 760 to the wall panel 50, as has been discussed. The attachment connector 760 also includes the previously discussed power receiving connector 810. As shown in FIGS. 41 and 42, part of the power receiving connector 810 projects out of the attachment connector 760 and the pins 811, 812 project out of the connector 810 for engagement with the conductors 451, 452, 453.

As shown in FIGS. 39 and 40, the attachment connector 760 includes a pair of rails 770 and slots 771 adjacent to the rails 770. The slots 771 are configured to accept rails from various previously discussed attachments 550 to connect the attachments with the attachment connector 760. The slots 771 and rails 770 are also configured so that they are identical to rails and slots of a power tool battery pack system, particularly, a power tool battery pack system including the battery pack 600. In this way, various accessories 550 which can attach to the connector 760 and be provided with electric power through the connector 760 may also be attached directly to a battery pack and powered directly by the battery pack. The battery pack may be a battery pack 600. Additionally, there may be other battery packs in the system.

Figure 43:
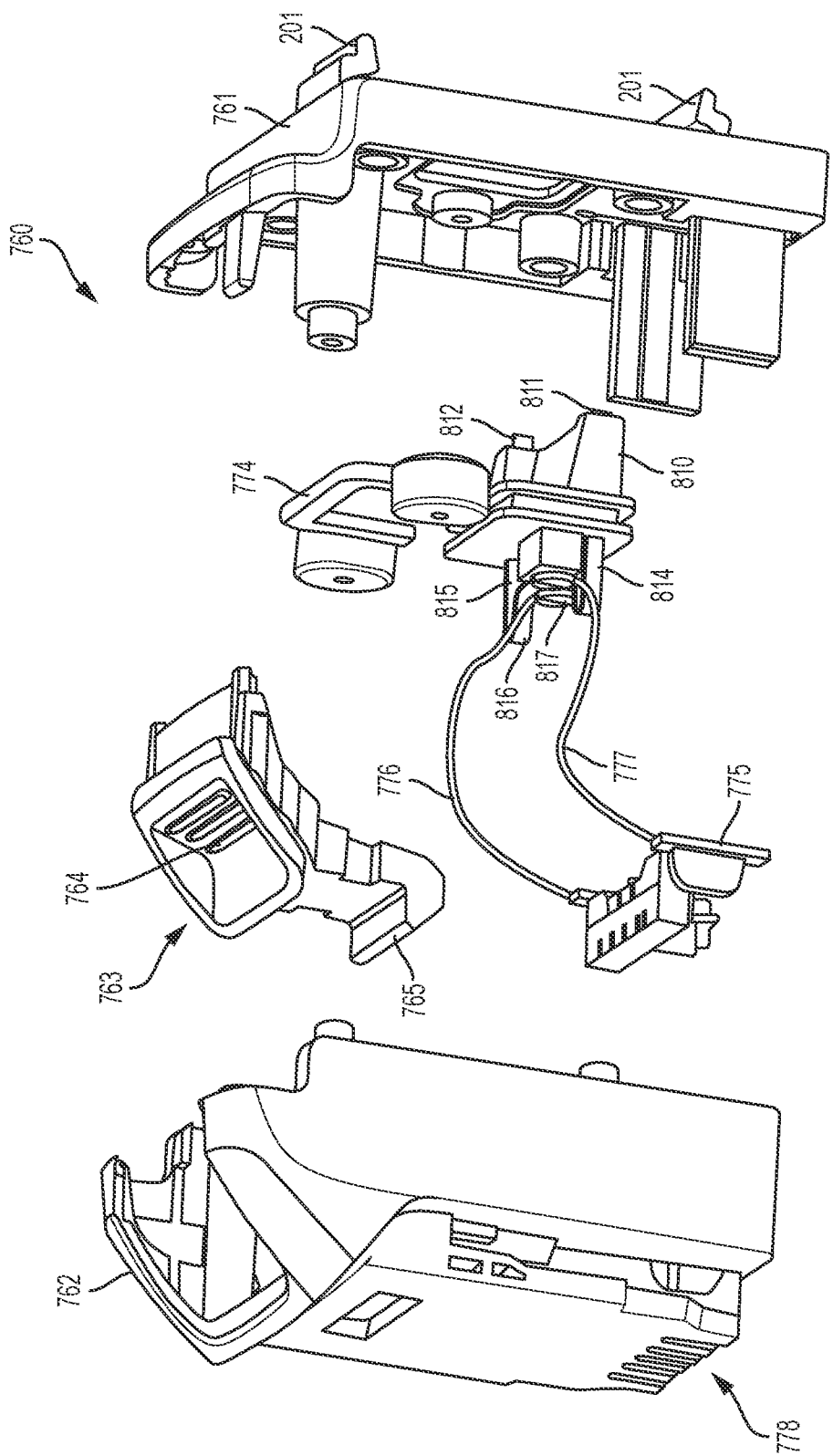
FIG. 43 is an exploded view of the attachment connector according to an exemplary embodiment.

FIG. 43 is an exploded view of the attachment connector 760. As shown, the attachment connector 760 includes a bottom housing part 761 and a top housing part 762. As shown in FIGS. 39, 40 and 43, the attachment connector 760 additionally has a latch 763 with a latch actuator 764 and a latching portion 765. The latching portion 765 is configured to latch onto one of the accessories 550 when the accessory 550 is slid onto the rails 770. The latching portion 765 thus secures the accessory 550 on the attachment connector 760. The latch 763 projects out of the top housing part 762 and is biased in a direction towards projecting out of the housing part 762 by a spring or other biasing member (not shown). When a user slides an attachment 550 onto the attachment connector 760, the latch 763 depresses towards the inside of the connector housing and then snaps back after the attachment 550 reaches a fully engaged position to secure the accessory 550 in place. A user releases the attachment 550 by depressing the latch actuator 764 to depress the latching portion 765.

A power receiving connector 810 is housed in the attachment connector 760. An electrical connector 775 is attached to the power receiving connector 810 through wires 776 and 777. The electrical connector 775 can be engaged through an electrical connector engagement portion 778. Thus, electricity can be provided from the power receiving connector 810 out through the attachment connector 760 to an attachment 550. A holding piece 774 helps to hold the receiving connector 810 in place.

As shown in FIG. 29, the attachment connector 760 is attachable to the panel 50 in two orientations. In one orientation, pin 811 engages the lower conductor 452 and in the second orientation the pin 811 engages upper conductor 541. In either case, pin 812 engages the central ground conductor 450.

Figure 48:
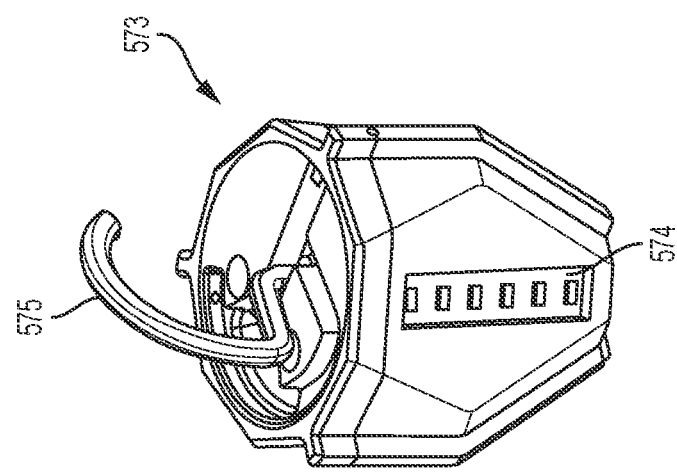
FIG. 48 is another perspective view of a lantern portion of the light according to an exemplary embodiment.
Figure 47:
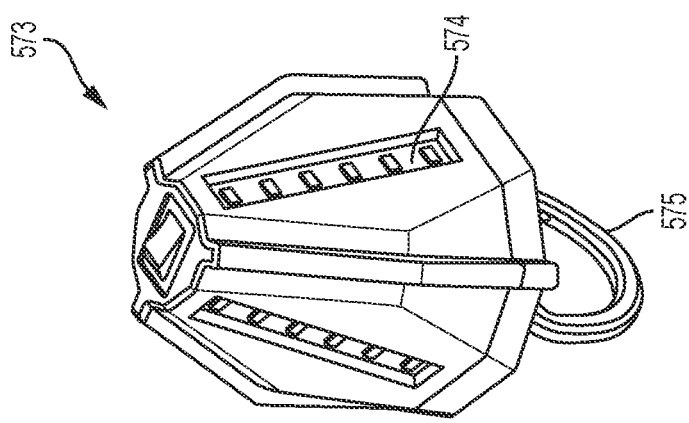
FIG. 47 is a perspective view of a lantern portion of the light according to an exemplary embodiment.
Figure 46:
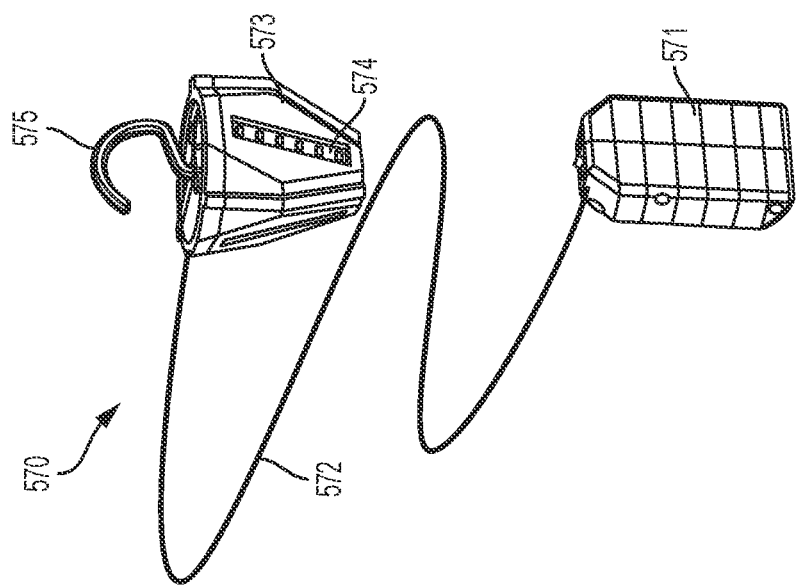
FIG. 46 is a perspective view of a light according to an exemplary embodiment.

The light attachment 570 is shown in FIGS. 46-48. As shown in those Figs., the light attachment 570 includes an engagement connector 571. The engagement connector 571 is configured to engage an attachment connector 760, as shown in FIG. 29. When attached to the attachment connector 760, the light 570 is provided with power through the conductors 451, 452, 453, through the previously discussed mechanisms. The engagement connector 571 is attached to a lantern 573. The lantern 573 includes a number of LED panels 574 which includes light emitting diodes (LEDs). The lantern 573 also includes a hook 575 for hanging the lantern 573. The engagement connector 571 could also be engaged with a battery pack such as battery pack 600 to provide power to the light 570 directly from the battery pack 600.

Figure 49:
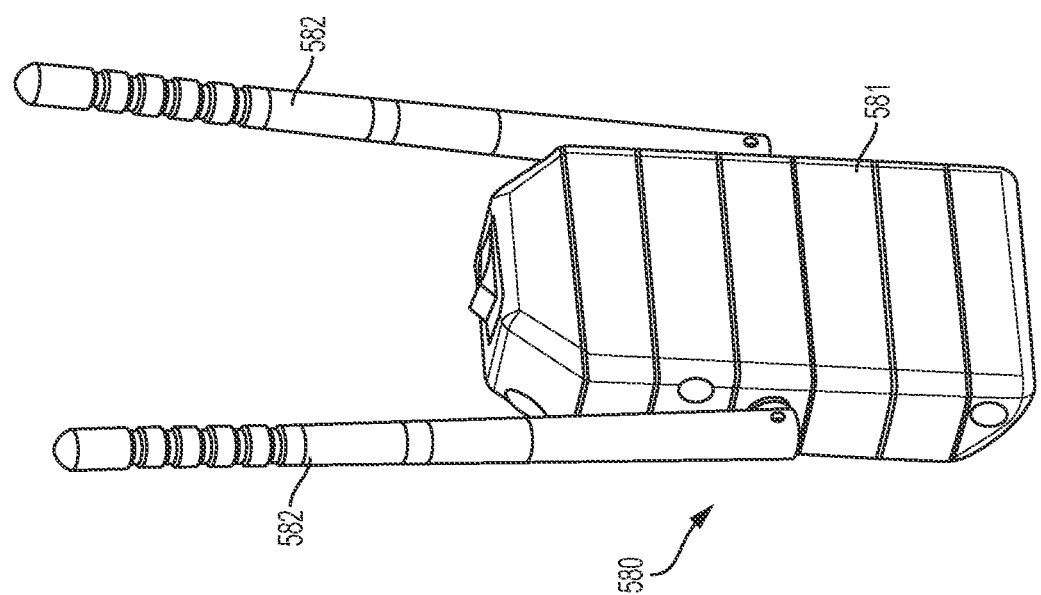
FIG. 49 is a perspective view of a Wi-Fi router according to an exemplary embodiment.

The Wi-Fi router 580 is illustrated in FIG. 49. The Wi-Fi router 580 is configured so that the body 581 of the router 580 engages with the attachment connector 760 so that power is provided to the router 580. The router 580 includes a pair of antennae 582. As with the light attachment 570, the Wi-Fi router 580 may also be also be engaged with a battery pack such as battery pack 600 to provide power to the light 580 directly from the battery pack 600.

Figure 50:
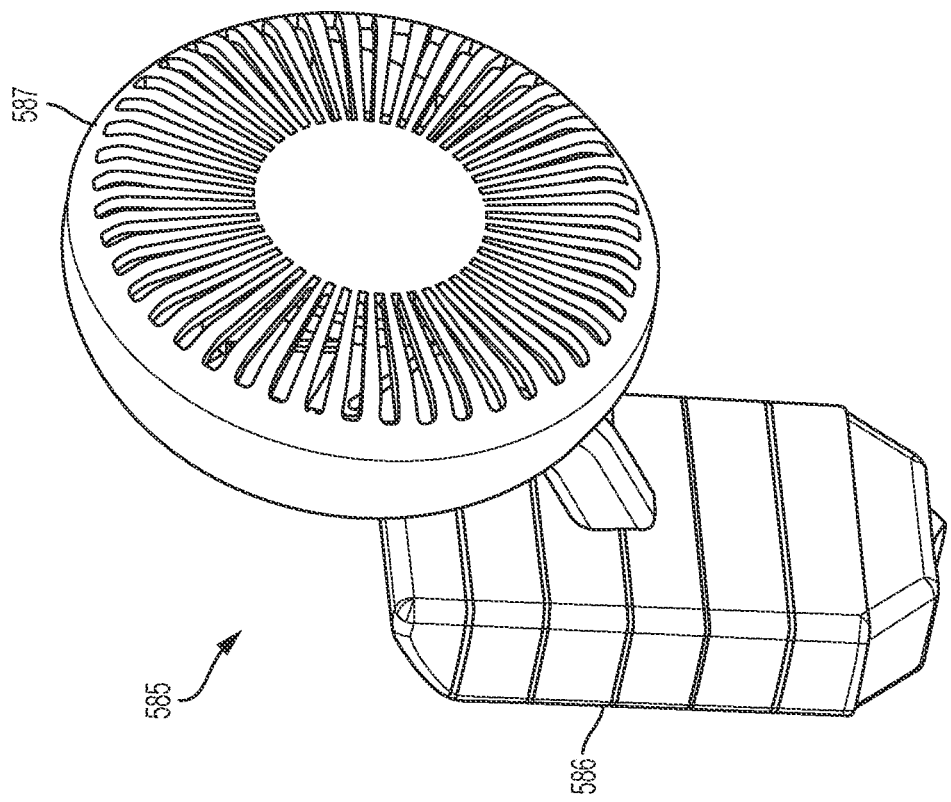
FIG. 50 is a perspective view of a fan according to an exemplary embodiment.

The fan 585 is shown in FIG. 50. The fan 585 has a body 586 which engages with the attachment connector 760 to provide power therethrough to the fan 585. The fan 585 also has an operating portion 587 which includes enclosed fan blades. The power supplied to the fan 585 powers a motor which rotates fan blades to produce airflow. The fan 585 may also be also be engaged with a battery pack such as battery pack 600 to provide power to the fan 585 directly from the battery pack 600.

Figure 51:
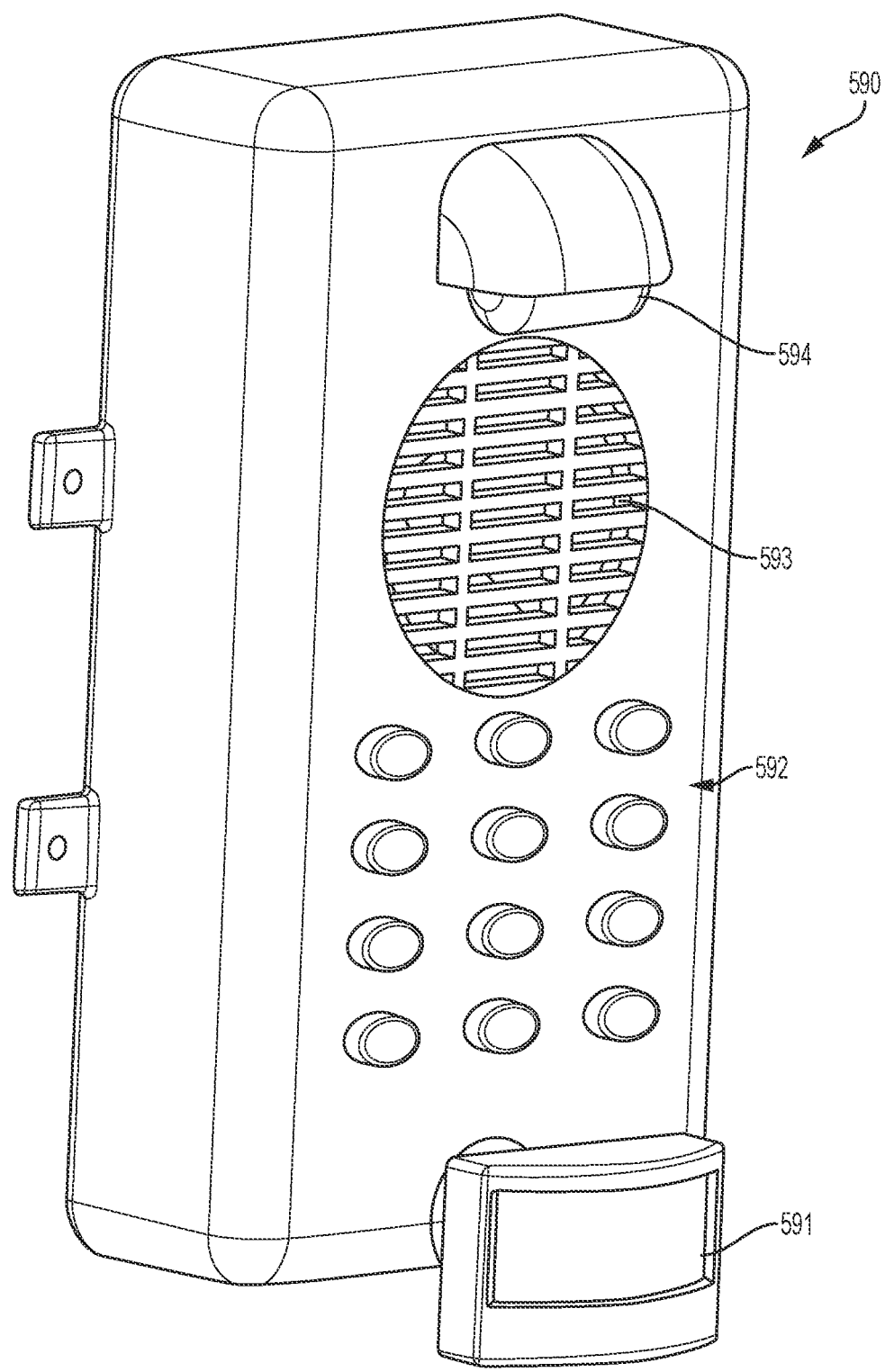
FIG. 51 is a perspective view of a security system according to an exemplary embodiment.

The security system 590 is shown in FIG. 51. The security system 590 is provided to prevent theft from the wall panel 50. The security system 590 includes a pair of clips 200 and a power receiving connector 810 so that it engages directly onto the wall panel 50 rather than through the attachment connector 760. When the security system 590 is attached to the wall panel 50 via the clips 200 the connector 810 engages the conductors 451, 452, 453, as is previously discussed, to provide power to the security system 590. The security system 590 includes a motion detector 591, a key pad 592, a speaker 593 and a light 594. It may also include a back-up battery (not shown) so that the security system 590 can operate even if there is no power provided by the control box 500. A user may set the security system 590 so that it sounds an alarm via the speaker 593 if the motion detector 591 detects motion. The key pad 592 allows a user to enter a code to disable or enable the system 590. The light 594 may be used an additional alarm indication or for illuminating the key pad 592.

In the exemplary embodiment shown in FIG. 29, the battery charger 560 and the security system 590 are connected directly to the conductors of the insert 450 and the light 570, Wi-Fi router 580 and fan 590 are connected through the attachment connector 760. In other embodiments, the different attachments could be directly connected or connected through the attachment connector 760. For example, in another exemplary embodiment a light could be configured to attached directly to the conductors 451, 452, 453. The light may have a similar design to the light 570 or be a different type of light. Similarly, there may be a security system which attaches to the wall panel 50 and conductors 451, 452, 453 through an attachment connector 760. There may also be additional attachments 550. For example, there may be attachments which provide a USB or standard electrical outlet. There could be a clock attachment or a heater attachment. All of these attachments 550 may be configured to be attached directly or through an attachment connector 760.

Figure 56:
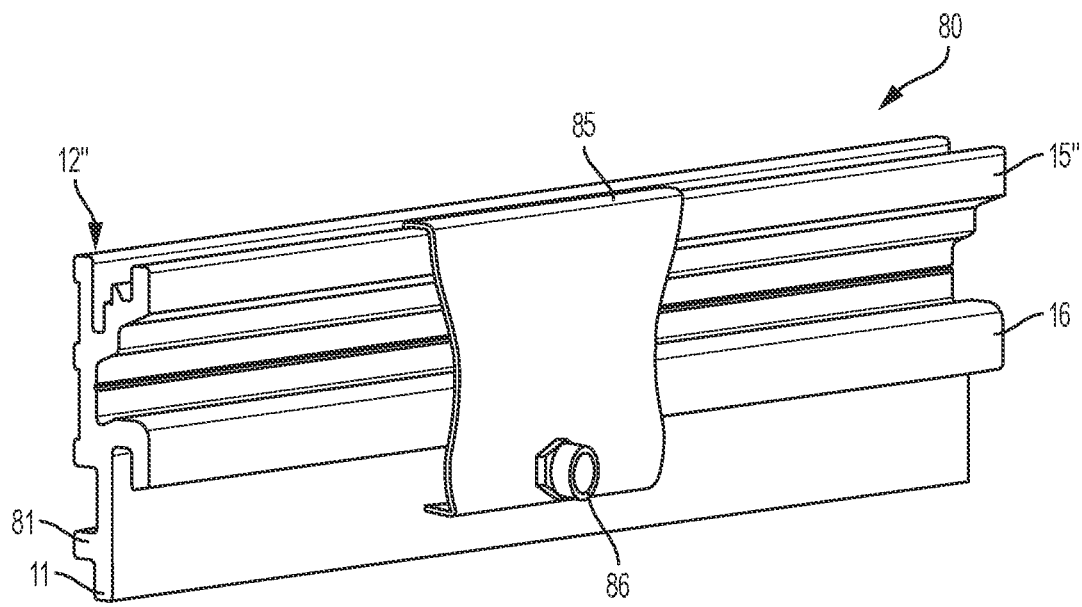
FIG. 56 is a perspective view of a wall panel and hook according to another exemplary embodiment.
Figure 57:
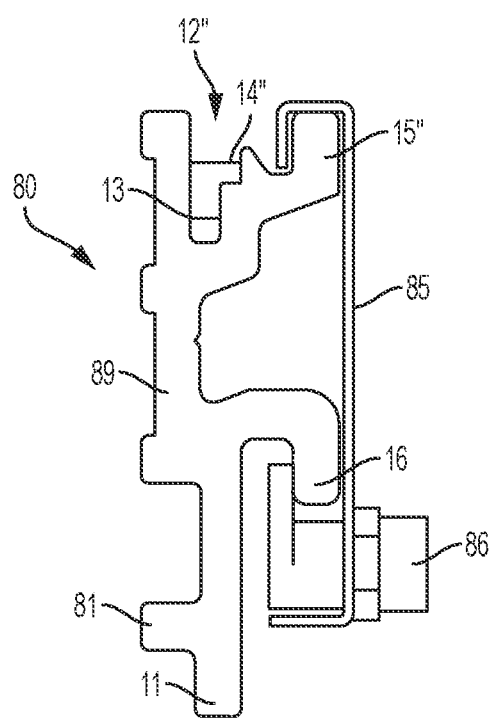
FIG. 57 is a side view of the wall panel and hook according to the exemplary embodiment.

FIGS. 56-61 illustrate a fifth wall panel 80. The fifth wall panel 80 may work with any of the other wall panels 10, 20, 30, 50. FIGS. 56 and 57 illustrate a perspective view of the fifth wall panel 80 with a hook 85 and latch member 86. FIGS. 58-61 illustrate various views of the wall panel 80 and hook 85.

The wall panel 80 includes a connector portion 11. The connector portion 11 is able to fit into the connector receiving portions 12, 12' previously described in order to connect the wall panel 80 with the various other wall panels. The connector portion 11 also allows the wall panel 80 to connect with other wall panels 80 of the same type, as is shown in FIGS. 58-61.

The fifth wall panel 80 also includes a modified connector receiving portion 12". The connector receiving portion 12" is configured to accept both peg boards 60 and the connector portion 11, as with the other connector receiving portions. As shown, the connector receiving portion 12" has a peg board opening 13 for receiving a peg board 60 and a panel opening 14" for receiving the connector portions 11.

The fifth wall panel 80 includes a rear side 89 which can be placed against a wall. On the front side the fifth wall panel 80 includes an upper panel hook 16 and a modified lower panel hook 15". These panel hooks 15" and 16 allow for a hook 85 to be attached to the fifth wall panel 80. The other various hooks described previously may also be attached to the fifth wall panel 80. The hook 85 includes a latch member 86 with a latch projection 87. The latch member 86, along with the latch projection 87, is rotatable to move from a locking position shown in FIG. 54 to an unlocked position (not shown). In the unlocked position, the latch projection 87 is rotated ninety degrees or more so that it does not overlap with the panel hook 16. The hook 85 and latch member 86 may be similar to the brackets and retaining members of U.S. Pat. No. 8,528,871, which is incorporated by reference.

Figure 59:
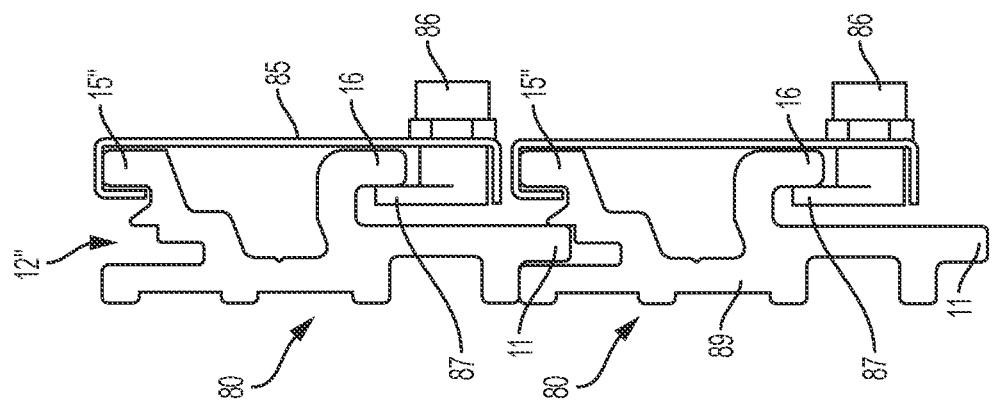
FIG. 59 is a side view of the wall panel and hook assembly according to the exemplary embodiment.

As shown in FIG. 57, the panel hook 15" overlaps with the connector receiving portion 12" in a horizontal plane when the fifth wall panel 80 is vertical (e.g., rear surface 89 placed against a vertical wall). In particular, it overlaps with the panel opening 14". When a connector portion 11 is in the panel opening 14", as shown in FIG. 59, the panel hook 15" overlaps with the connector portion 11. This provides for a compact design with the features of multiple hooks 15", a connector portion 11, and a connector receiving portion 12".

The wall panel 80 also includes a spacing projection 81. The spacing projection 81 is adjacent to the connector portion 11 and projects generally perpendicularly to the connector portion 11. The spacing projection 81 is on the rear side 89 of the panel 80 and abuts a wall when the wall panel 80 is placed against a vertical wall. As shown in FIG. 59, the spacing projection 81 also serves to abut a portion of an adjacent wall panel 80 when multiple wall panels 80 are connected to one another.

Figure 58:
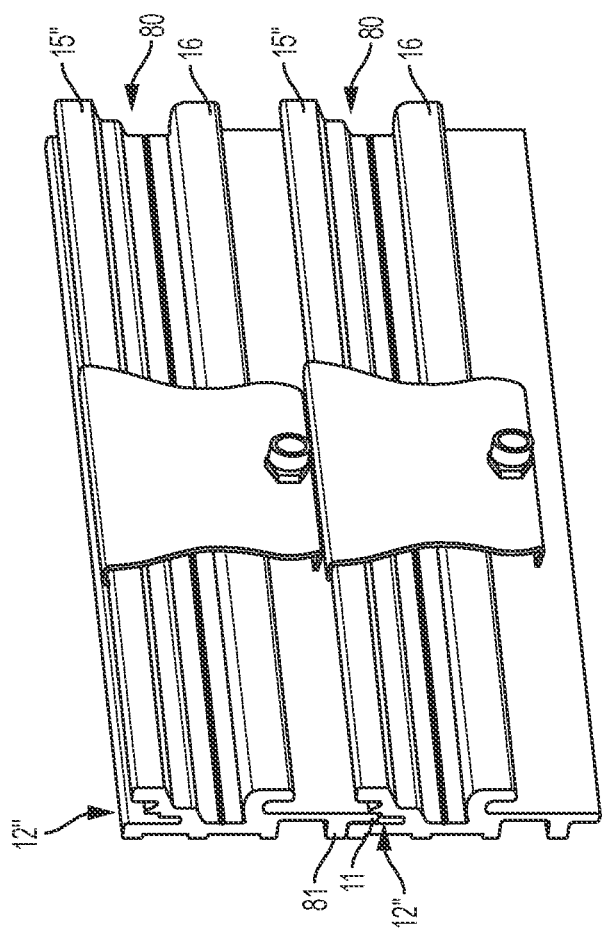
FIG. 58 is a perspective view of a wall panel and hook assembly according to the exemplary embodiment.
Figure 61:
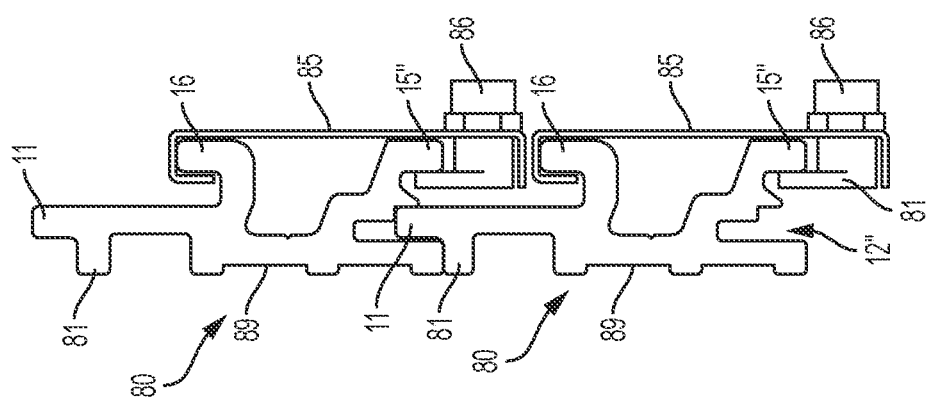
FIG. 61 is a side view of the wall panel and hook assembly according to the exemplary embodiment.
Figure 60:
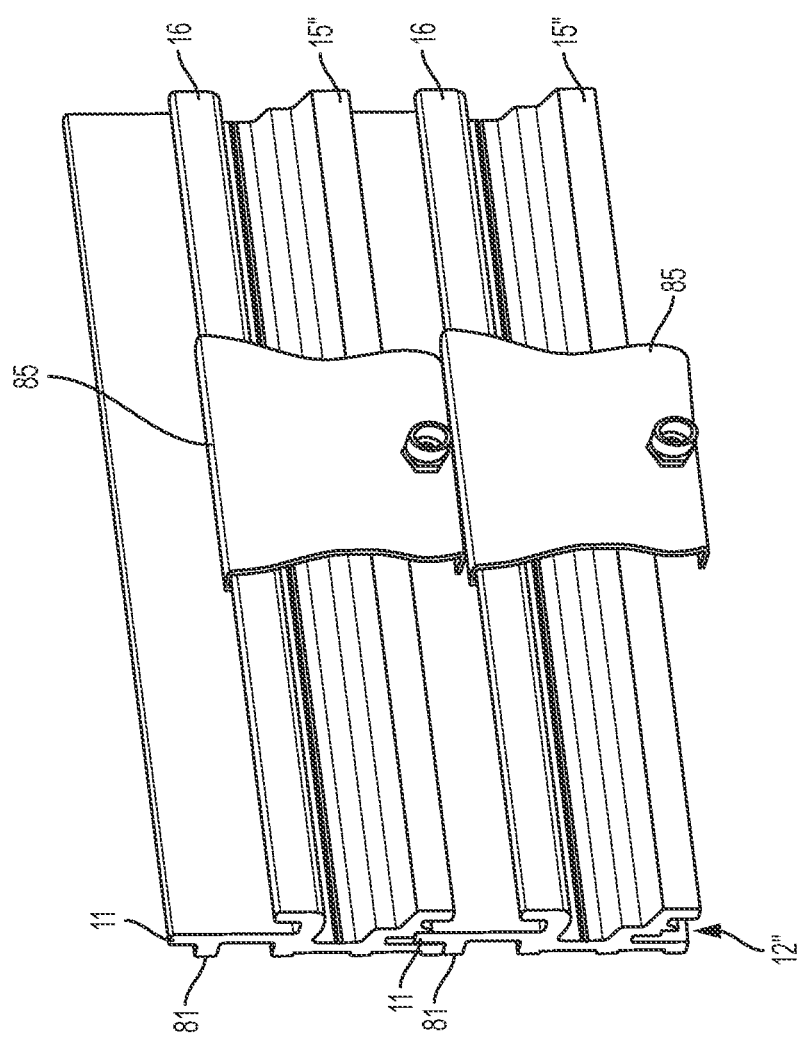
FIG. 60 is a perspective view of the wall panel and hook assembly according to the exemplary embodiment.

As shown in FIGS. 58 and 59, more than one fifth wall panel 80 may be engaged to form a wall panel assembly. Additionally, multiple hooks 85 may be used in the assembly. As shown in FIG. 60, the fifth wall panels 80 may be flipped so that the connector portions 11 are at the bottom of the wall panels 80, as shown in FIGS. 58 and 59, or at the top of the wall panels 80, as shown in FIGS. 60 and 61.

While the invention has been described by way of exemplary embodiments, it is understood that the words which have been used herein are words of description, rather than words of limitation. Changes may be made within the purview of the appended claims, without departing from the scope and spirit of the invention in its broader aspects.

What is claimed is:

1. A wall panel system, comprising:
   a first wall panel, the first wall panel configured to abut a wall;
   a second wall panel, the second wall panel configured to abut the wall;
   a securing member comprising at least one hook and configured to be removably secured to the first wall panel or the second wall panel;
   wherein the first wall panel comprises a first projection and a first space behind the first projection;
   wherein the first wall panel comprises a second projection and a second space behind the second projection;
   wherein when the securing member is secured to the first wall panel, a first portion of the securing member abuts a generally rearward facing surface of the first projection and is in the first space;
   wherein when the securing member is secured to the first wall panel, a second portion of the securing member abuts a generally rearward facing surface of the second projection and is in the second space;
   wherein when the securing member is secured to the first wall panel, a third portion of the securing member extends between the first portion and the second portion;
   wherein the first projection faces the second projection;
   wherein when the securing member is secured to the first wall panel, a fourth portion of the securing member abuts a generally forward-facing surface of the second projection.

2. The wall panel system of claim 1, wherein the at least one hook is integrally formed with the securing member.

3. The wall panel system of claim 1, wherein the at least one hook extends away from the first wall panel.

4. The wall panel system of claim 1, wherein the at least one hook comprises at least two hooks.

5. The wall panel system of claim 1, wherein the generally rearward facing surface of the first projection is in the same plane as the generally rearward facing surface of the second projection.

6. The wall panel system of claim 1, wherein the wall panel system further comprises a cabinet engaged with at least one of the first wall panel or the second wall panel.

7. The wall panel system of claim 1, further comprising a third wall panel;
   wherein the third wall panel is configured to be engaged with at least one of the first wall panel or the second wall panel; and
   wherein the third wall panel comprises a groove and a power strip in the groove.

8. The wall panel system of claim 1, further comprising a clip configured to be secured to the first wall panel or the second wall panel,
   wherein the clip comprises a base portion and a pair of legs at opposite ends of the base portion, and
   wherein the legs are flexible.

9. The wall panel system of claim 1, further comprising a conductor wall panel;
   wherein the conductor wall panel is configured to engage with at least one of the first wall panel and the second wall panel;
   wherein the conductor wall panel comprises at least three conductors extending along a longitudinal length of the conductor wall panel;
   wherein the at least three conductors run parallel to one another;
   further comprising a power supply device on the conductor wall panel
   further comprising a power receiving device on the conductor wall panel; and
   wherein the power receiving device comprises at least one of a battery charger, a light, a fan and an electrical outlet.

10. The wall panel system of claim 1, wherein the first wall panel has the same configuration as the second wall panel.

11. A wall panel system, comprising:
    a first wall panel, the first wall panel being attached to the wall at a stud;
    a second wall panel, the second wall panel being adjacent to the first wall panel and attached to the wall;
    a securing member comprising a first hook and removably secured to the first wall panel;
    wherein the first wall panel comprises a first projection and a first space behind the first projection;
    wherein the first wall panel comprises a second projection and a second space behind the second projection;
    wherein a first portion of the securing member abuts a generally rearward facing surface of the first projection and is in the first space;
    wherein a second portion of the securing member abuts a generally rearward facing surface of the second projection and is in the second space;

wherein a third portion of the securing member extends between the first portion and the second portion;

wherein a fourth portion of the securing member abuts a generally forward facing surface of the second projection;

wherein the first projection faces the second projection; and wherein the first wall panel is elongated along a longitudinal axis.

12. The wall panel system of claim 11, wherein the first wall panel comprises an engagement projection;

wherein the second wall panel comprises an engagement recess; and wherein the engagement projection is disposed the engagement recess.

13. The wall panel system of claim 12, further comprising a tool disposed on the hook.

14. The wall panel system of claim 12, further comprising a battery charger secured to the first wall panel.

15. The wall panel system of claim 12, further comprising an illumination device secured to the first wall panel.

16. The wall panel system of claim 12, further comprising a conductor wall panel;

wherein the conductor wall panel is engaged with the first wall panel;

wherein the conductor wall panel comprises at least three conductors extending along a longitudinal length of the conductor wall panel; and further comprising a power supply device on the conductor wall panel.

17. A wall panel system, comprising:

a first wall panel, the first wall panel configured to abut a wall;

a securing member comprising at least one hook and configured to be removably secured to the first wall panel;

wherein the first wall panel comprises a first projection and a first space behind the first projection;

wherein the first wall panel comprises a second projection and a second space behind the second projection;

wherein when the securing member is secured to the first wall panel, a first portion of the securing member abuts a generally rearward facing surface of the first projection and is in the first space;

wherein when the securing member is secured to the first wall panel, a second portion of the securing member abuts a generally rearward facing surface of the second projection and is in the second space;

wherein when the securing member is secured to the first wall panel, a third portion of the securing member extends between the first portion and the second portion;

wherein the first projection faces the second projection;

wherein when the securing member is secured to the first wall panel, a fourth portion of the securing member abuts a generally forward-facing surface of the second projection.

18. The wall panel system of claim 17, wherein the at least one hook is integrally formed with the securing member; and wherein the at least one hook extends away from the first wall panel.

19. The wall panel system of claim 17, wherein the at least one hook comprises at least two hooks.

20. The wall panel system of claim 17, wherein the generally rearward facing surface of the first projection is in the same plane as the generally rearward facing surface of the second projection.

\* \* \* \* \*